(12) United States Patent
Wada

(10) Patent No.: US 8,552,572 B2
(45) Date of Patent: Oct. 8, 2013

(54) RESIN COMPOSITION FOR ENCAPSULATING SEMICONDUCTOR AND SEMICONDUCTOR DEVICE USING THE SAME

(75) Inventor: Masahiro Wada, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 238 days.

(21) Appl. No.: 13/055,706

(22) PCT Filed: Jul. 22, 2009

(86) PCT No.: PCT/JP2009/003425
§ 371 (c)(1),
(2), (4) Date: Jan. 24, 2011

(87) PCT Pub. No.: WO2010/013406
PCT Pub. Date: Feb. 4, 2010

(65) Prior Publication Data
US 2011/0124775 A1    May 26, 2011

(30) Foreign Application Priority Data

Aug. 1, 2008 (JP) ................................. 2008-200160

(51) Int. Cl.
*H01L 23/29* (2006.01)
*C08L 63/00* (2006.01)
*C08G 59/62* (2006.01)

(52) U.S. Cl.
USPC ........... 257/793; 523/451; 523/457; 525/523; 525/534

(58) Field of Classification Search
USPC .................. 523/400, 451, 457; 525/523, 534; 257/787, 788, 793
See application file for complete search history.

(56) References Cited

U.S. PATENT DOCUMENTS

| | | | | |
|---|---|---|---|---|
| 8,138,266 B2 * | 3/2012 | Kuroda | ......................... | 525/109 |
| 2005/0267237 A1 * | 12/2005 | Kuroda | ......................... | 523/443 |
| 2005/0267286 A1 * | 12/2005 | Nakamura et al. | ............. | 528/408 |
| 2008/0246008 A1 * | 10/2008 | Kuroda | ......................... | 252/510 |

FOREIGN PATENT DOCUMENTS

| | | |
|---|---|---|
| JP | 59-105018 | 6/1984 |
| JP | 4-325517 | 11/1992 |
| JP | 5-166974 | 7/1993 |
| JP | 2001-310931 | 11/2001 |
| JP | 2004-155841 | 6/2004 |
| JP | 2004-203911 | 7/2004 |
| JP | 2005015561 A * | 1/2005 |
| JP | 2005-206725 | 8/2005 |

OTHER PUBLICATIONS

Machine translation of JP 2005015561 A, provided by the JPO website (no date).*
International Search Report for International Application No. PCT/JP2009/003425, Oct. 20, 2009.

* cited by examiner

*Primary Examiner* — Michael J Feely
(74) *Attorney, Agent, or Firm* — Ditthavong Mori & Steiner, P.C.

(57) ABSTRACT

Provided is a resin composition for encapsulating a semiconductor which has excellent flame resistance and solder resistance, and can be manufactured at a low cost. The composition includes a phenol resin (A), an epoxy resin (B), and an inorganic filler (C). The phenol resin (A) includes at least one polymer component (A0) composed of a polymer having structural units represented by general formulae (1) and (2), and at least one polymer component (A0) is composed of a polymer having structural units represented by general formulae (1) and (2) and terminated on at least one end with an aromatic group free of polar groups and containing at least one alkyl group having 1 to 3 carbon atoms:

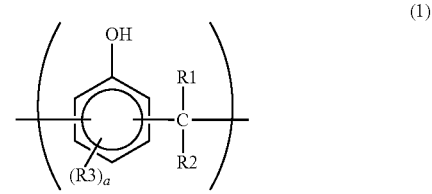

(1)

wherein R1 and R2 are each independently a hydrogen atom or a hydrocarbon group having 1 to 6 carbon atoms; each R3 is independently a hydrocarbon group having 1 to 6 carbon atoms; and a is an integer of 0 to 3 ,

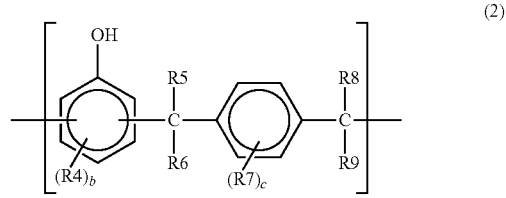

(2)

wherein R5, R6, R8 and R9 are each independently a hydrogen atom or a hydrocarbon group having 1 to 6 carbon atoms; each R4 and R7 is independently a hydrocarbon group having 1 to 6 carbon atoms; b is an integer of 0 to 3; and c is an integer of 0 to 4.

21 Claims, 11 Drawing Sheets

RESIN COMPOSITION FOR ENCAPSULATING SEMICONDUCTOR AND SEMICONDUCTOR DEVICE USING THE SAME

TECHNICAL FIELD

The present invention relates to a resin composition for encapsulating a semiconductor and a semiconductor device using the resin composition.

BACKGROUND ART

In recent years, with higher density and higher integration of electronic components and semiconductor devices such as integrated circuits (ICs), large scale integrated circuits (LSIs), very large scale integrated circuits (VLSIs) and the like, a method of mounting thereof has been changed from insertion mounting method to a surface mounting method. With that, lead frames with an increased number of pins and lead with narrower pitch intervals have been in demand, and surface mounting type QFPs (Quad Flat Packages) and the like capable of coping with small size and lightweight have been used for various semiconductor devices. Encapsulating of the semiconductor device is mainly conducted using an epoxy resin composition from the viewpoint of excellent balance of productivity, cost, reliability and the like.

In the past, for the purpose of imparting flame retardance, a bromine-containing epoxy resin and an antimony oxide have been generally used for an epoxy resin composition for encapsulating a semiconductor. However, recently, there is a growing move to limit the use of a halogenated compound which might generate a dioxin analogue compound or a highly toxic antimony compound from the viewpoint of environmental protection. As an alternative flame retardant of a brominated epoxy resin or an antimony compound, metal oxides such as aluminum hydroxide, magnesium hydroxide and the like have been used. However, these flame retardants cause deterioration of flowability due to an increase in the molten resin viscosity, or deterioration of solder resistance in some cases.

From the above-stated circumstances, as an epoxy resin composition for encapsulating a semiconductor capable of achieving excellent flame retardance without the need of adding a flame retardance-imparting agent, there has been proposed an epoxy resin composition using a phenol aralkyl type epoxy resin having a biphenylene skeleton (for example, Patent Documents 1 and 2). These epoxy resin compositions have advantages of flame retardance, low moisture absorption, low elastic modulus when being heated and high adhesiveness, whereas such resins do not exhibit enough flowability for encapsulating a thinned and miniaturized semiconductor device.

Patent Document 1: JP-A-2004-203911
Patent Document 2: JP-A-2004-155841

DISCLOSURE OF THE INVENTION

The present invention has been accomplished in view of the above circumstances, and is to provide a resin composition for encapsulating a semiconductor which has excellent flame resistance and solder resistance, and is excellent in flowability.

According to the present invention for solving the above objects, there is provided a resin composition for encapsulating a semiconductor including a phenol resin (A) containing a polymer (A0) having structural units represented by the following general formulae (1) and (2), and composed of one or more components having an aromatic group having at least one alkyl group with 1 to 3 carbon atoms at least at one end;

an epoxy resin (B); and an inorganic filler (C),

[Chemical Formula 1]

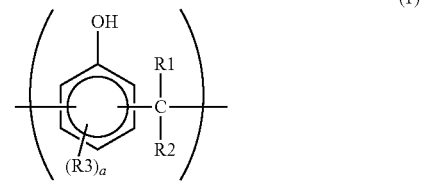

wherein, in the general formula (1), R1 and R2 are each independently a hydrogen atom or a hydrocarbon group having 1 to 6 carbon atoms; R3s are each independently a hydrocarbon group having 1 to 6 carbon atoms; and a is an integer of 0 to 3,

[Chemical Formula 2]

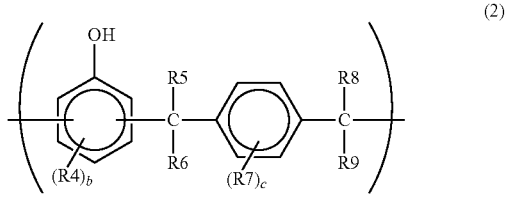

wherein, in the general formula (2), R5, R6, R8 and R9 are each independently a hydrogen atom or a hydrocarbon group having 1 to 6 carbon atoms; R4 and R7 are each independently a hydrocarbon group having 1 to 6 carbon atoms; b is an integer of 0 to 3; and c is an integer of 0 to 4.

In the above-stated resin composition for encapsulating a semiconductor, said phenol resin (A) contains a polymer (A1) having structural units represented by the following general formulae (31) and (32), and composed one or more components, and a part or all of said components of the polymer (A0) and the polymer (A1) may be the same,

[Chemical Formula 3]

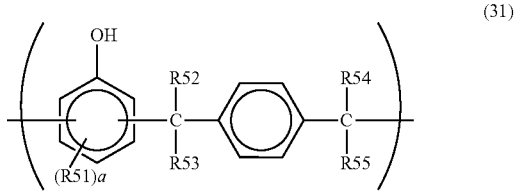

wherein, in the above general formula (31), R51s are each independently a hydrocarbon group having 1 to 6 carbon atoms; a is an integer of 0 to 3; and R52, R53, R54 and R55 are each independently a hydrogen atom or a hydrocarbon group having 1 to 6 carbon atoms,

[Chemical Formula 4]

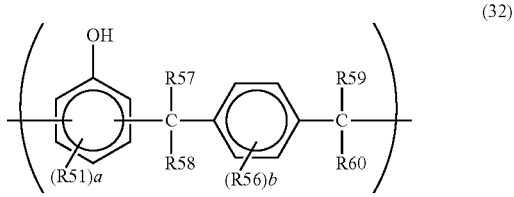

(32)

wherein, in the above the general formula (32), R51s are each independently a hydrocarbon group having 1 to 6 carbon atoms; a is an integer of 0 to 3; R56s are each independently a hydrocarbon group having 1 to 6 carbon atoms; b is an integer of 1 to 4; and R57, R58, R59 and R60 are each independently a hydrogen atom or a hydrocarbon group having 1 to 6 carbon atoms.

In the above-stated resin composition for encapsulating a semiconductor, in the measurement by the field desorption mass spectrometry, the total relative intensity of a polymer corresponding to the polymer (A1) is from 10% to 80%, based on the total relative intensity of said phenol resin (A).

In the above-stated resin composition for encapsulating a semiconductor, said phenol resin (A) further includes a component (A2) composed of a polymer having structural units represented by the general formula (31) but without having structural units represented by the general formula (32).

In the above-stated resin composition for encapsulating a semiconductor, said phenol resin (A) further includes a component (A3) composed of a polymer having structural units represented by the general formula (32) but without having structural units represented by the general formula (31).

In the above-stated resin composition for encapsulating a semiconductor, the ratio of the total number of structural units represented by the general formula (31) to the total number of structural units represented by the general formula (32) is from 30/70 to 95/5 based on the total phenol resin (A).

In the above-stated resin composition for encapsulating a semiconductor, in structural units represented by the general formula (32), R56 is a methyl group, and b is from 1 to 3.

In the above-stated resin composition for encapsulating a semiconductor, said aromatic group having at least one alkyl group with 1 to 3 carbon atoms is a trimethylphenyl group.

In the above-stated resin composition for encapsulating a semiconductor, said phenol resin (A) includes a polymer represented by the following general formula (3),

[Chemical Formula 5]

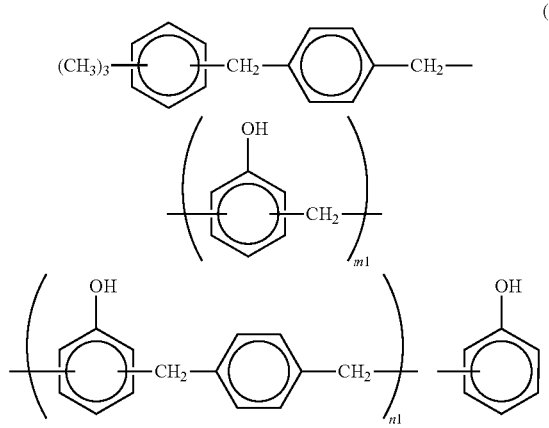

(3)

wherein, in the general formula (3), m1 is a mean value and is a number of from 0.3 to 7; and n1 is a mean value and is a number of from 0.3 to 7.

In the above-stated resin composition for encapsulating a semiconductor, said phenol resin (A) includes a polymer represented by the following general formula (4),

[Chemical Formula 6]

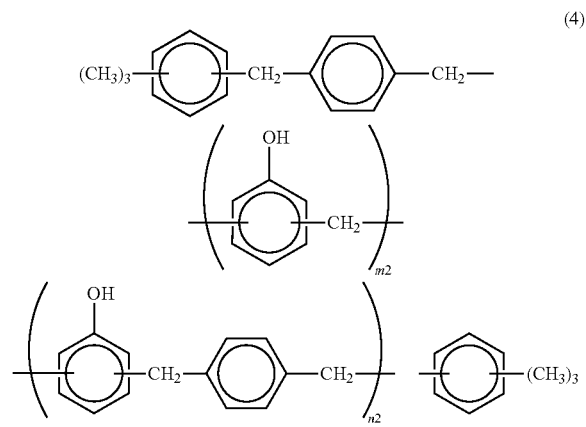

(4)

wherein, in the general formula (4), m2 is a mean value and is a number of from 0.3 to 7; and n2 is a mean value and is a number of from 0.1 to 4.

In the above-stated resin composition for encapsulating a semiconductor, a curing agent is further contained in addition to said phenol resin (A), and said phenol resin (A) is contained in an amount of 15 to 100% by mass in the total curing agent.

In the above-stated resin composition for encapsulating a semiconductor, said epoxy resin (B) is at least one epoxy resin selected from the group consisting of a biphenyl type epoxy resin, a bisphenol type epoxy resin, a stilbene type epoxy resin, an anthracenediol type epoxy resin, a phenol novolac type epoxy resin, a cresol novolac type epoxy resin, a triphenolmethane type epoxy resin, an alkyl-modified triphenolmethane type epoxy resin, a phenol aralkyl type epoxy resin having a phenylene skeleton, a phenol aralkyl type epoxy resin having a biphenylene skeleton, a naphthol aralkyl type epoxy resin having a phenylene skeleton, a dihydroxy naphthalene type epoxy resin, an epoxy resin obtained by glycidyl etherification of dimers of dihydroxy naphthalene, a novolac type epoxy resin having a methoxynaphthalene skeleton, triglycidyl isocyanurate, monoallyl diglycidyl isocyanurate and a dicyclopentadiene-modified phenol type epoxy resin.

In the above-stated resin composition for encapsulating a semiconductor, the content of said inorganic filler (C) is from 80 to 93% by mass.

The above-stated resin composition for encapsulating a semiconductor further includes a curing accelerator (D).

In the above-stated resin composition for encapsulating a semiconductor, said curing accelerator (D) includes at least one kind selected from a tetra-substituted phosphonium compound, a phosphobetaine compound, an adduct of a phosphine compound and a quinone compound, and an adduct of a phosphonium compound and a silane compound.

The above-stated resin composition for encapsulating a semiconductor further includes a compound (E) in which a hydroxyl group is bonded to each of two or more adjacent carbon atoms constituting an aromatic ring.

The above-stated resin composition for encapsulating a semiconductor further includes a coupling agent (F).

In the above-stated resin composition for encapsulating a semiconductor, said coupling agent (F) includes a silane coupling agent having a secondary amino group.

The above-stated resin composition for encapsulating a semiconductor further includes an inorganic flame retardant.

In the above-stated resin composition for encapsulating a semiconductor, said inorganic flame retardant includes metal hydroxide or complex metal hydroxide.

Furthermore, according to the present invention, there is provided a semiconductor device obtained by encapsulating a semiconductor element with the above-stated resin composition for encapsulating a semiconductor.

According to the present invention, there is provided a resin composition for encapsulating a semiconductor which has excellent flame resistance and solder resistance, and is excellent in flowability.

BRIEF DESCRIPTION OF THE DRAWINGS

The above and other objects, features and advantages of the present invention will be more apparent from the following description of the preferred embodiments in conjunction with the accompanying drawings.

BEST MODE FOR CARRYING OUT THE INVENTION

Figure 1:
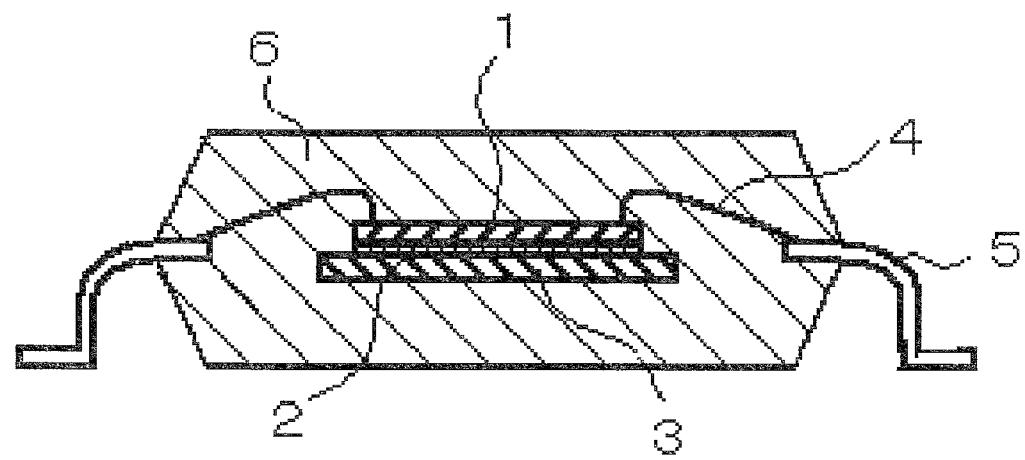
FIG. 1 is a cross-section view showing one example of a semiconductor device using a resin composition for encapsulating a semiconductor according to the present invention.

Preferred embodiments of the resin composition for encapsulating a semiconductor and the semiconductor device according to the present invention will be described in detail with reference to the drawings. Incidentally, in the description of the drawings, the same components are assigned the same reference numerals and appropriate explanations thereof will be omitted.

The semiconductor resin composition of the present invention includes a phenol resin (A) containing a polymer (A0) having structural units represented by the following general formulae (1) and (2), and composed of one or more components having an aromatic group having at least one alkyl group with 1 to 3 carbon atoms at least at one end;
an epoxy resin (B); and
an inorganic filler (C),

[Chemical Formula 7]

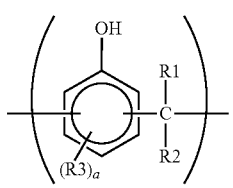

(1)

wherein, in the general formula (1), R1 and R2 are each independently a hydrogen atom or a hydrocarbon group having 1 to 6 carbon atoms; R3s are each independently a hydrocarbon group having 1 to 6 carbon atoms; and a is an integer of 0 to 3,

[Chemical Formula 8]

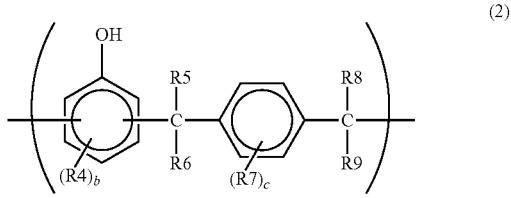

(2)

wherein, in the general formula (2), R5, R6, R8 and R9 are each independently a hydrogen atom or a hydrocarbon group having 1 to 6 carbon atoms; R4 and R7 are each independently a hydrocarbon group having 1 to 6 carbon atoms; b is an integer of 0 to 3; and c is an integer of 0 to 4.

The phenol resin (A) used in the present invention contains a polymer (A0) composed of one or more components having an aromatic group having at least one alkyl group with 1 to 3 carbon atoms at one end. Such an aromatic group introduced into the end functions as a polymerization terminator in the polymerization reaction of the phenol resin (A) with the epoxy resin (B). The molecular weight of the thus-obtained polymer can be suppressed to a relatively low level, so that the obtained resin composition has high flowability. Accordingly, the obtained resin composition has excellent operability. Furthermore, the phenol resin (A) has hydrophobicity because of the presence of the alkyl group having 1 to 3 carbon atoms bonded to this aromatic group. As a result, the obtained resin composition has high solder resistance. Furthermore, a cured product of such a resin composition is excellent in flame resistance.

For the polymer (A0) of the present invention, the molecular weight is preferably from 200 to 1,500, more preferably from 300 to 1,400, and further preferably from 350 to 1,200, when measured by the field desorption mass spectrometry (FD-MS). When the molecular weight of the polymer (A0) is within the above range, a resin composition which is well-balanced in flowability and curability may be obtained.

In the above-stated polymer (A0), when the total amount of the above-stated structural units (1) and (2) in one molecule of the phenol resin is 100% by mole, the proportion of structural units (1) is k (% by mole), and the proportion of structural units (2) is l (% by mole). At this time, k is preferably from 0 to 70 and more preferably from 15 to 60, while l is preferably from 10 to 90 and more preferably from 20 to 80. When respective structural units are within the above range, a resin composition excellent in a balance of curability, flame resistance and moisture resistance may be obtained.

The polymer (A0) may be obtained by copolymerization of an alkyl-substituted aromatic compound, a phenol compound, aldehyde, and a compound represented by the following general formula (5),

[Chemical Formula 9]

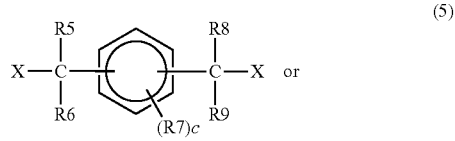

(5)

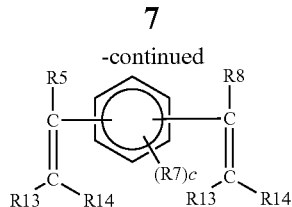

wherein, in the general formula (5), R5, R6, R7, R8, R9 and c are the same as those defined in the above general formula (2); R13 and R14 are each independently a hydrocarbon group having 1 to 5 carbon atoms or a hydrogen atom; and X is a halogen atom, a hydroxyl group or an alkoxy group having 1 to 6 carbon atoms.

The above-stated alkyl-substituted aromatic compound used for the synthesis of the polymer (A0) has at least one alkyl group, and at least one hydrogen atom which can be substituted, in the aromatic ring. Such an alkyl-substituted aromatic compound does not contain a polar group, whereby it has the following properties at the time of copolymerization, (i) the polymerization reactivity with aldehyde is extremely low due to the absence of a polar group;

(ii) the reaction with the compound represented by the general formula (5) (aromatic crosslinking group) can be carried out; and (iii) because of steric hindrance due to a relatively high bulky alkyl group, the elongation of the molecular chain scarcely takes place in the reaction with the compound represented by the general formula (5).

Accordingly, the alkyl-substituted aromatic compound is bonded to one end or both ends of the molecular chain so that the elongation growth of the molecular chain of the phenol resin is suppressed. Accordingly, such suppression contributes to improvement of flowability of the obtained phenol resin.

The alkyl-substituted aromatic compound used for the production of the polymer (A0) has at least one alkyl group, and at least one hydrogen atom which can be substituted, in the aromatic ring, and is not particularly limited as long as it does not contain a polar group. Examples of the alkyl-substituted aromatic compound include toluene, o-xylene, m-xylene, p-xylene, 1,3,5-trimethylbenzene, 1,2,3-trimethylbenzene, 1,2,4-trimethylbenzene, ethylbenzene, o-diethylbenzene, m-diethylbenzene, p-diethylbenzene, 1,3,5-triethylbenzene, 1,2,3-triethylbenzene, 1,2,4-triethylbenzene, cumene, o-cymene, m-cymene, p-cymene, n-butylbenzene, sec-butylbenzene, tert-butylbenzene, pentylbenzene, dipentylbenzene and the like. Among these compounds, preferably used is trimethylbenzene from the viewpoint of introduction of a hydrophobic group, and preferably used are 1,2,4-trimethylbenzene and 1,3,5-trimethylbenzene from the viewpoints of flowability, raw material costs and the like. These compounds may be used singly or may be used in combination of two or more kinds.

Examples of the phenol compound used for the production of the polymer (A0) include phenol, o-cresol, p-cresol, m-cresol, phenylphenol, ethylphenol, n-propylphenol, isopropylphenol, t-butylphenol, xylenol, methylpropylphenol, methylbutylphenol, dipropylphenol, dibutylphenol, nonylphenol, mesitol, 2,3,5-trimethylphenol, 2,3,6-trimethylphenol and the like, but are not restricted thereto. Among these compounds, preferably used are phenol and o-cresol, and more preferably used is phenol from the viewpoint of reactivity with the epoxy resin. These compounds may be used singly or may be used in combination of two or more kinds.

Examples of aldehyde used for the production of the polymer (A0) include formaldehyde, paraformaldehyde, acetaldehyde, benzaldehyde and the like. Among these compounds, preferably used are formaldehyde and paraformaldehyde from the viewpoints of curability and raw material costs of the resin composition.

The compound represented by the following general formula (5) (aromatic crosslinking group) is used for the production of the polymer (A0),

[Chemical Formula 10]

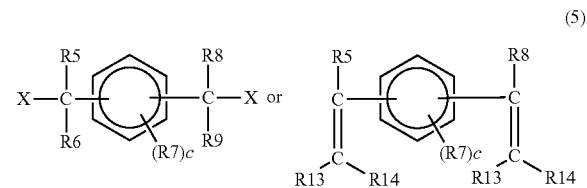

(5)

wherein, in the general formula (5), R5, R6, R7, R8, R9 and c are the same as those defined in the above general formula (2); R13 and R14 are each independently a hydrocarbon group having 1 to 5 carbon atoms or a hydrogen atom; and X is a halogen atom, a hydroxyl group or an alkoxy group having 1 to 6 carbon atoms.

In R5, R6, R8 and R9 of the general formula (5), examples of the hydrocarbon group having 1 to 6 carbon atoms include a methyl group, an ethyl group, a propyl group, an n-butyl group, an isobutyl group, a t-butyl group, an n-pentyl group, a 2-methylbutyl group, a 3-methylbutyl group, a t-pentyl group, an n-hexyl group, a 1-methylpentyl group, a 2-methylpentyl group, a 3-methylpentyl group, a 4-methylpentyl group, a 2,2-dimethylbutyl group, a 2,3-dimethylbutyl group, a 2,4-dimethylbutyl group, a 3,3-dimethylbutyl group, a 3,4-dimethylbutyl group, 4,4-dimethylbutyl group, a 2-ethylbutyl group, a 1-ethylbutyl group, a cyclohexyl group, a phenyl group and the like.

In R7 of the general formula (5), examples of the hydrocarbon group having 1 to 6 carbon atoms include a methyl group, an ethyl group, a propyl group, an n-butyl group, an isobutyl group, a t-butyl group, an n-pentyl group, a 2-methylbutyl group, a 3-methylbutyl group, a t-pentyl group, an n-hexyl group, a 1-methylpentyl group, a 2-methylpentyl group, a 3-methylpentyl group, a 4-methylpentyl group, a 2,2-dimethylbutyl group, a 2,3-dimethylbutyl group, a 2,4-dimethylbutyl group, a 3,3-dimethylbutyl group, a 3,4-dimethylbutyl group, a 4,4-dimethylbutyl group, a 2-ethylbutyl group, a 1-ethylbutyl group, a cyclohexyl group, a phenyl group and the like.

Examples of =CR13R14 (alkylidene group) in the general formula (5) include a methylidene group, an ethylidene group, a propylidene group, an n-butylidene group, an isobutylidene group, a t-butylidene group, an n-pentylidene group, a 2-methylbutylidene group, a 3-methylbutylidene group, a t-pentylidene group, an n-hexylidene group, a 1-methylpentylidene group, a 2-methylpentylidene group, a 3-methylpentylidene group, a 4-methylpentylidene group, a 2,2-dimethylbutylidene group, a 2,3-dimethylbutylidene group, a 2,4-dimethylbutylidene group, a 3,3-dimethylbutylidene group, a 3,4-dimethylbutylidene group, a 4,4-dimethylbutylidene group, a 2-ethylbutylidene group, a 1-ethylbutylidene group and a cyclohexylidene group and the like.

In X of the general formula (5), examples of the halogen atom include a fluorine atom, a chlorine atom, a bromine atom, an iodine atom and the like. Examples of the alkoxy group having 1 to 6 carbon atoms include a methoxy group, an ethoxy group, a propoxy group, an n-butoxy group, an isobutoxy group, a t-butoxy group, an n-pentoxy group, a 2-methylbutoxy group, a 3-methylbutoxy group, a t-pentoxy group, an n-hexoxy group, a 1-methylpentoxy group, a 2-methylpentoxy group, a 3-methylpentoxy group, a 4-methylpentoxy group, a 2,2-dimethylbutoxy group, a 2,3-dimethylbutoxy group, a 2,4-dimethylbutoxy group, a 3,3-dimethylbutoxy group, a 3,4-dimethylbutoxy group, a 4,4-dimethylbutoxy group, a 2-ethylbutoxy group, a 1-ethylbutoxy group and the like.

The compounds represented by the general formula (5) may be used singly or may be used in combination of two or more kinds. Among these compounds, m- and p-xylylene glycol can be synthesized at a relatively low temperature, and removal and handling of a reaction by-product are easy, so that the compounds are preferred. When X is a halogen atom, hydrogen halide caused by the presence of a trace of moisture may be used as an acidic catalyst.

A method for synthesizing the phenol resin (A) used in the present invention is not particularly limited, and examples thereof include the following methods.

First Production Method

The compound represented by the general formula (5) and aldehyde of 0.2 to 0.8 mole in total, the alkyl-substituted aromatic compound of 0.05 to 0.25 mole, and an acidic catalyst such as formic acid, oxalic acid, p-toluenesulfonic acid, hydrochloric acid, sulfuric acid, phosphoric acid, acetic acid, Lewis acid or the like of 0.01 to 0.05 mole, based on 1 mole of the phenol compound, are reacted at a temperature of 50° C. to 200° C. for 2 to 20 hours, while discharging generated gas and moisture out of the system by nitrogen flow, and monomers remained after completion of the reaction by a method such as vacuum distillation, steam distillation or the like may be distilled off. Or, while, as a reaction operation, the phenol compound, the compound represented by the general formula (5) and aldehyde are subjected to a condensation reaction using an acidic catalyst, the alkyl-substituted aromatic compound may be added to the reaction system from the middle of the reaction to the end of the reaction. In this case, the progress of the reaction may also be confirmed by the situation where water, hydrogen halide and alcohol gas by-produced during the reaction of the alkyl-substituted aromatic compound with phenol come into existence, or by the molecular weight measured according to the gel permeation chromatography method by sampling a product produced during the reaction.

Here, in order to obtain the phenol resin (A) with lower viscosity, there may be used a method for reducing generation of high molecular weight components by a means including increasing the amount of the phenol compound to be mixed, increasing the amount of the alkyl-substituted aromatic compound to be mixed, adding the alkyl-substituted aromatic compound at the early stage of the reaction, reducing the amount of the acidic catalyst to be mixed, rapidly discharging once produced hydrogen halide gas out of the system by nitrogen flow or the like, lowering the cocondensation temperature, or the like. Furthermore, a phenol resin having the low content of the structural units of the formula (1) may be produced by reducing the amount of aldehyde to be mixed or gradually adding aldehyde to the reaction system.

Incidentally, the proportion of the structural units of the general formulae (1) and (2) contained in the phenol resin (A) almost reflects the proportion of the raw material in use.

In the synthesis of the above-state phenol resin (A), when addition or bonding of the alkyl-substituted aromatic compound takes place, further addition of the phenol compound, aldehyde or the compound of the general formula (5) is suppressed due to steric hindrance present in the alkyl group of the alkyl-substituted aromatic compound. Accordingly, as a result, the alkyl-substituted aromatic compound is introduced into the end without causing the elongation of the molecular chain. Furthermore, as the amount of the alkyl-substituted aromatic compound used for the synthesis is higher, a phenol resin containing a phenol resin with the alkyl-substituted aromatic compound bonded to both ends in large quantities is obtained. Incidentally, introduction of the alkyl-substituted aromatic compound may be confirmed by measuring the obtained phenol resin by the FD-MS method.

The phenol resin (A) of the present invention may contain a polymer (A1) having structural units represented by the following general formulae (31) and (32). The polymer (A1) contains one or more components.

[Chemical Formula 11]

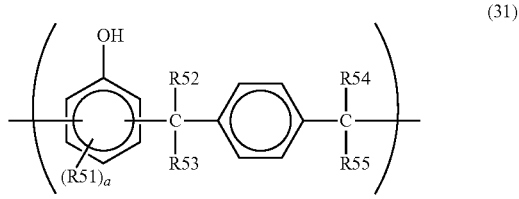

(31)

wherein, in the above general formula (31), R51s are each independently a hydrocarbon group having 1 to 6 carbon atoms; a is an integer of 0 to 3; and R52, R53, R54 and R55 are each independently a hydrogen atom or a hydrocarbon group having 1 to 6 carbon atoms,

[Chemical Formula 12]

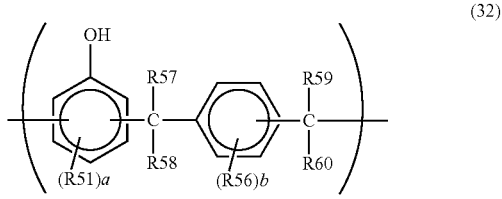

(32)

wherein, in the above the general formula (32), R51s are each independently a hydrocarbon group having 1 to 6 carbon atoms; a is an integer of 0 to 3; R56s are each independently a hydrocarbon group having 1 to 6 carbon atoms; b is an integer of 1 to 4; and R57, R58, R59 and R60 are each independently a hydrogen atom or a hydrocarbon group having 1 to 6 carbon atoms.

The polymer (A1) contained in the phenol resin (A) may exhibit excellent curability and solder resistance by having a skeleton structure similar to the phenol aralkyl type phenol resin (A) having a phenylene skeleton, and may further exhibit excellent moisture resistance because the substituent of R56 of structural units represented by the general formula (32) is hydrophobic. Furthermore, the polymer (A1) contained in the phenol resin (A) also has properties such that adhesion hardly takes place and excellent handling properties are exhibited, as compared to the phenol aralkyl resin having a phenylene skeleton having a substantially equal molecular weight. The detailed reason why adhesion hardly takes place is not clear, but it is considered because an intermolecular force (van der Waals force) is locally strong, and accordingly the movement of molecules is constrained by partly containing the substituent of R56 and as a result, the softening point is relatively increased. The resin composition using the phenol resin (A) may exhibit excellent flowability and curability without damaging handling properties, and the cured product thereof has properties such as excellent flame resistance, a low moisture absorption coefficient and improved soldering crack resistance.

The phenol resin (A) contains the polymer (A1) having structural units represented by the general formula (31) and structural units represented by the general formula (32), but it may further contain a component (A2) composed of a polymer having structural units represented by the general formula (31) but without containing structural units represented by the general formula (32), or a component (A3) composed of a polymer containing structural units represented by the general formula (32) but without containing structural units represented by the general formula (31). The ratio of the total number of structural units represented by the general formula (31) to the total number of structural units represented by the general formula (32) is preferably from 30/70 to 95/5, more preferably from 40/60 to 90/10, and particularly preferably from 50/50 to 85/15, based on the total amount of the phenol resin (A). Here, "to" in the specification includes both upper and lower numbers. When the ratio by the mean value of the repeated number of both structural units is within the above range, a resin composition excellent in a balance of flame resistance, handling properties, continuous molding properties and solder resistance may be obtained. Furthermore, the ratio of the total number of structural units represented by the general formula (31) to the total number of structural units represented by the general formula (32), in the total amount of the phenol resin (A), may be obtained by the field desorption mass spectrometry (FD-MS) measurement. With respect to respective peaks detected by the FD-MS analysis and measured in the detected mass (m/z) range of 50 to 2,000, the molecular weight from the detected mass (m/z) and the repeated number may be obtained, and the intensity ratio of respective peaks is further arithmetically computed as the content ratio (mass), whereby the content ratio of respective structural units of the general formulae (31) and (32) may be obtained.

The phenol resin (A) of the present invention contains a polymer (A0) and a polymer (A1), and the polymer (A0) and the polymer (A1) may respectively contain one or more components. In this case, a part or all of components of the polymer (A0) and the polymer (A1) may be the same.

The above-stated phenol resin (A) may contain a polymer represented by the following general formula (3).

[Chemical Formula 13]

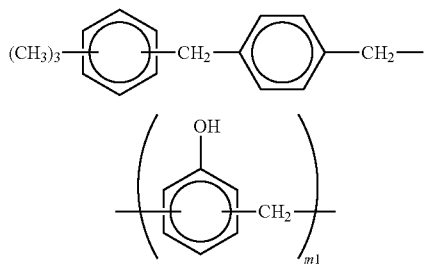

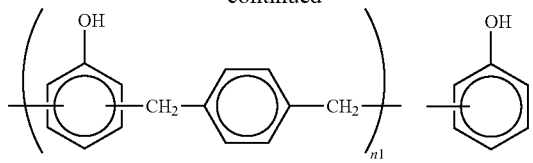

The compound represented by the general formula (3) is a mixture of compounds in which m1 is an integer of 0 to 20, and n1 is an integer of 0 to 20 per one molecule. Accordingly, when m1 and n1 in the mixture are each noted in terms of a mean value, m1 in terms of the mean value is from 0.3 to 7 and more preferably from 0.5 to 2, and n1 in terms of the mean value is from 0.3 to 7 and more preferably from 0.5 to 2. When m1 is smaller than the above lower limit, curability of the obtained resin composition may be deteriorated. On the other hand, when m1 is greater than the above upper limit, flowability of the obtained resin composition may be deteriorated because the viscosity of the phenol resin itself is high. Meanwhile, when n1 is smaller than the above lower limit, flame resistance and soldering crack resistance of the obtained resin composition may be deteriorated. On the other hand, when n1 is greater than the above upper limit, flowability of the obtained resin composition may be deteriorated because the viscosity of the phenol resin itself is high. Incidentally, the values of m1 and n1 may be obtained by the FD-MS analysis. The molecular weight of the compound of the general formula (3) measured by the FD-MS analysis is from 350 to 1,200 and preferably from 400 to 900. From the viewpoint of a balance of flowability, curability, flame resistance and solder resistance, the amount of the polymer of the general formula (3) is preferably from 80 to 95% by mass, based on the total amount of the above-stated polymer (A0) containing structural units represented by the general formulae (1) and (2), and having an aromatic group having at least one alkyl group with 1 to 3 carbon atoms at least at one end.

Furthermore, the above-stated phenol resin (A) may contain a polymer represented by the following general formula (4).

[Chemical Formula 14]

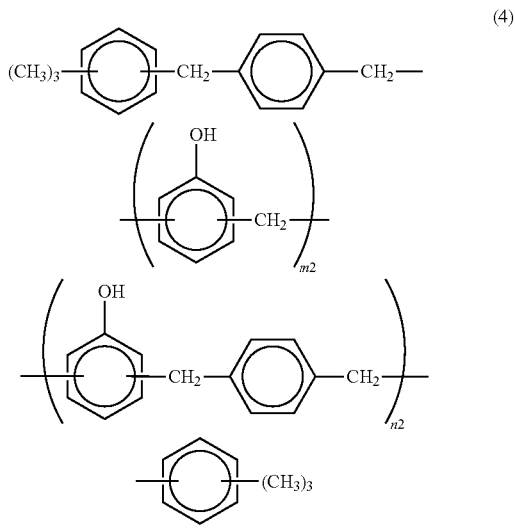

The compound represented by the general formula (4) is also a mixture of compounds in which m2 is an integer of 0 to 20, and n2 is an integer of 0 to 20 per one molecule. Accordingly, when m2 and n2 in the mixture are each noted in terms of a mean value, n2 in terms of the mean value is from 0.1 to 4 and more preferably from 0.3 to 1.5, and m2 in terms of the mean value is from 0.3 to 7 and more preferably from 0.8 to 3. When m2 is smaller than the above lower limit, curability of the obtained resin composition may be deteriorated. On the other hand, when m2 is greater than the above upper limit, flowability of the obtained resin composition may be deteriorated because the viscosity of the phenol resin itself is high. Meanwhile, when n2 is smaller than the above lower limit, flame resistance and soldering crack resistance of the obtained resin composition may be deteriorated. On the other hand, when n2 is greater than the above upper limit, flowability of the obtained resin composition may be deteriorated because the viscosity of the phenol resin itself is high. Incidentally, the values of m2 and n2 may be obtained by the FD-MS analysis. The molecular weight of the compound of the general formula (4) measured by the FD-MS analysis is preferably from 550 to 1,200 and more preferably from 600 to 900. From the viewpoint of a balance of flowability, curability, flame resistance and solder resistance, the amount of the polymer of the general formula (4) is preferably from 5 to 20% by mass, based on the total amount of the above-stated polymer (A0) containing structural units represented by the general formulae (1) and (2), and having an aromatic group having at least one alkyl group with 1 to 3 carbon atoms at least at one end.

The polymer represented by the general formulae (3) and (4) may be obtained by reacting, for example, phenol, p-xylene glycol, formaldehyde and 1,3,5-trimethylbenzene or 1,2,4-trimethylbenzene.

Second Production Method

Aldehyde is added in an amount of 1 to 2.5 mole, and an alkali metal catalyst such as sodium hydroxide, potassium hydroxide or the like as a catalyst, or a strong acid such as para-toluenesulfonic acid, xylenesulfonic acid, sulfuric acid or the like is added in an amount of 0.1 to 2.5 mole, based on 1 mole of the alkyl-substituted aromatic compound represented by the general formula (35). In case of the alkali metal catalyst, the mixture is reacted at a temperature of 5° C. to 80° C., and in case of the acidic catalyst, the mixture is reacted at a temperature of 100° C. to 150° C. for 0.5 to 5 hours to obtain a reaction intermediate. Subsequently, a compound represented by the general formula (33) is added in an amount of 0.2 to 5 mole, a phenol compound is added in an amount of 1 to 20 mole, and an acidic catalyst such as oxalic acid, p-toluenesulfonic acid, methanesulfonic acid, hydrochloric acid, sulfuric acid, phosphoric acid, acetic acid, Lewis acid or the like is added in an amount of 0.005 to 0.05 mole. The mixture is subjected to a cocondensation reaction at a temperature of 50° C. to 200° C. for 2 to 20 hours while discharging generated gas out of the system by nitrogen flow, and monomers and moisture remained after completion of the reaction may be distilled off by a method such as vacuum distillation, steam distillation or the like. When X in the general formula (33) is a halogen atom, hydrogen halide caused by the presence of a trace of moisture may be used as an acidic catalyst.

[Chemical Formula 15]

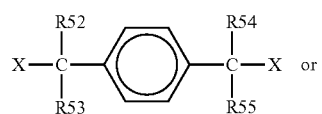
(33)

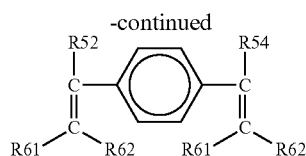

wherein, in the general formula (33), R52, R53, R54 and R55 are each independently a hydrogen atom or a hydrocarbon group having 1 to 6 carbon atoms; X is a halogen atom, a hydroxyl group or an alkoxy group having 1 to 6 carbon atoms; and R61 and R62 are each independently a hydrocarbon group having 1 to 5 carbon atoms or a hydrogen atom,

[Chemical Formula 16]

(35)

wherein, in the general formula (35), R56s are each independently a hydrocarbon group having 1 to 6 carbon atoms; and b is an integer of 1 to 4.

The phenol resin (A) obtained by the second production method is a mixture of polymers in which it is represented by the following general formula (37), i is an integer of 0 to 20, j is an integer of 0 to 20, and k is an integer of 0 to 20,

[Chemical Formula 17]

(37)

wherein, R51s are each independently a hydrocarbon group having 1 to 6 carbon atoms; a is an integer of 0 to 3; R56s are each independently a hydrocarbon group having 1 to 6 carbon atoms; b is an integer of 1 to 4; and R52, R53, R54, R55, R57, R58, R59, R60, R65 and R66 are each independently a hydrogen atom or a hydrocarbon group having 1 to 6 carbon atoms. The end of the molecule is a phenyl group in which 1 to 4 of hydrogen atoms, substituted or unsubstituted hydroxyphenyl groups or hydrocarbon groups having 1 to 6 carbon atoms are substituted.

In the mixture of polymers in which it is represented by the general formula (37), i is an integer of 0 to 20, j is an integer of 0 to 20, and k is an integer of 0 to 20, when the values of i, j an k are expressed in terms of the mean value, the mean value of i is from 0.5 to 7 and more preferably from 1 to 4, the mean value of j is from 0.2 to 3 and more preferably from 0.4 to 2, and the mean value of k is from 0 to 5 and more preferably from 0 to 3. When i is smaller than the above lower limit, curability of the obtained resin composition might be deteriorated. When i is greater than the above upper limit, flowability of the obtained resin composition might be deteriorated because the viscosity of the phenol resin itself is high. Furthermore, when j is smaller than the above lower limit, the obtained phenol resin might be easily adhered, and soldering crack resistance of the obtained resin composition might be deteriorated. When j is greater than the above upper limit, flowability and curability of the resin composition might be deteriorated. Besides, when k is smaller than the above lower limit, curability might be deteriorated. When k is greater than the above upper limit, flame resistance of the resin composition might be deteriorated. Incidentally, values of i, j and k may be obtained by the FD-MS analysis. The molecular weight of the compound of the general formula (37) measured by the FD-MS analysis is from 350 to 1,200 and preferably from 400 to 900. In consideration of easy handling properties of the phenol resin itself, and a balance of flowability, curability, flame resistance and solder resistance as the resin composition, the polymer (A1) containing structural units represented by the general formula (31) and structural units represented by the general formula (32) is contained in the amount of preferably from 5 to 80% by mass, more preferably from 8 to 70% by mass, and particularly preferably from 11 to 50% by mass, based on the total amount of the phenol resin (A) obtained by the second production method.

Here, as a method of increasing the content of the polymer (A1) containing structural units represented by the general formula (31) and structural units represented by the general formula (32) contained in the phenol resin (A) obtained by the second production method, there is cited, for example, a method including reducing the mixing amount of the compound represented by the general formula (33), or a method including gradually adding it to the reaction system.

The phenol resin (A) obtained by the second production method contains a polymer without containing structural units represented by the general formula (31) and without containing structural units represented by the general formula (32) (a component in which, in the general formula (37), i=0 and j=0) as a by-product. However, it may contain these by-products in the ranges in which handling properties as the phenol resin (A), and curability, flowability and flame resistance of the resin composition are not damaged. Furthermore, as a method including reducing the content of the above-stated by-products, there is cited a method including reducing the mixing amount of formaldehyde, or removing unreacted aldehyde remained in the reaction intermediate by a known method such as recrystallization, pressure reduction or the like.

Binuclear components may be contained in the phenol resin (A) obtained by the second production method in some cases. As for the content thereof, the content obtained by the area method of gel permeation chromatography (GPC) is preferably not more than 20% and more preferably not more than 15%. When the amount of the binuclear components is greater than the above upper limit, blocking of the phenol resin (A) may easily take place, or curability of the resin composition may be deteriorated. As a method of reducing the above-mentioned amount of binuclear components, binuclear components may be reduced by increasing the pressure reduction degree or prolonging the processing time during steam distillation or vacuum distillation after the reaction of phenol.

Herein, in order to obtain the phenol resin (A) with lower viscosity, there may be used a method for reducing generation of high molecular weight components by a means including increasing the amount of the phenol compound to be mixed, reducing the amount of formaldehyde components, reducing the amount of the acidic catalyst to be mixed, or rapidly discharging once produced hydrogen halide gas out of the system by nitrogen flow or the like, lowering the cocondensation temperature, or the like. In this case, the progress of the reaction may also be confirmed by the situation where water, hydrogen halide and alcohol gas by-produced during the reaction of the general formula (33), the general formula (34), the reaction intermediate with phenol come into existence, or by the molecular weight measured according to the gel permeation chromatography method by sampling a product produced during the reaction.

The phenol resin (A) used in the present invention is composed of one or more components, and contains the polymer (A1) having structural units represented by the general formula (31) and structural units represented by the general formula (32). Specifically, the phenol resin (A) may have the following components (1) and (2) as an essential component, or may contain the following components (3) to (6):

(1) a resin having the same structure as the phenol aralkyl resin having a phenylene skeleton, in which a part of the hydrogen atom having a phenylene skeleton is substituted with a hydrocarbon group having 1 to 6 carbon atoms;

(2) a resin having the same structure as the phenol resin obtained by copolymerization of the phenol aralkyl resin having a phenylene skeleton and the phenol novolac type resin, in which a part of the hydrogen atom having a phenylene skeleton is substituted with a hydrocarbon group having 1 to 6 carbon atoms;

(3) a phenol aralkyl resin having a phenylene skeleton;

(4) a phenol novolac type resin;

(5) a phenol resin obtained by copolymerization of a phenol aralkyl resin having a phenylene skeleton and a phenol novolac type resin; and (6) a polymer in which a phenol group obtained by substituting 1 to 4 of hydrocarbon groups having 1 to 6 carbon atoms is boned to the end of the molecule or the substituent of the hydroxyphenyl group of the above phenol resins (1) to (5) via a methylene group or a paraxylylene group.

Because of the presence of the polymer having a plurality of aforementioned structures, the resin composition may be excellent in handling properties as adhesion hardly takes place even though it has lower viscosity than the phenol aralkyl resin having a phenylene skeleton, may be excellent in solder resistance and flame resistance without damaging curability, and may also exhibit excellent continuous molding property. In particular, in case of the second production method, such a phenol resin may be produced at a low cost, and the raw material cost is cheaper than the phenol aralkyl resin having a phenylene skeleton.

The phenol resin (A) used in the present invention is not restricted to a polymer (A0) having structural units represented by the general formulae (1) and (2), and composed of one or more components having an aromatic group having at least one alkyl group with 1 to 3 carbon atoms at least at one end, specifically, a resin obtained by substituting the phenol portions at one end or both ends of the phenol aralkyl type resin with an alkyl-substituted aromatic compound, or a resin obtained by substituting the phenol portions at one end or both ends of the phenol resin obtained by the copolymerization of a phenol aralkyl type resin and a phenol novolac type resin with an alkyl-substituted aromatic compound, and it may contain a by-product to be produced at the same time during the production of the appropriate phenol resin in the above-stated method, i.e., a phenol aralkyl type resin, a phenol novolac type resin or a phenol resin obtained by the copolymerization of a phenol aralkyl type resin with a phenol novolac type resin. Since a plurality of aforementioned structures are contained, the resin composition may be excellent in flame resistance, may hardly cause blocking even though it has lower viscosity than the phenol aralkyl resin, may be excellent in handling properties, and may exhibit low moisture absorption. Furthermore, such a phenol resin may be produced at a low cost, and the raw material cost in total is cheaper than the phenol aralkyl resin.

When the phenol resin (A) contains a phenol novolac type resin, the content of the phenol novolac type resin contained in the polymer (A0) is from 5 to 20% by mass and more preferably from 5 to 15% by mass, based on the total amount of the polymer (A0) in use. Within the above-stated range, excellent curability and flame resistance may be achieved. The content of the phenol novolac type resin contained in the phenol resin (A) may be determined by both FD-MS analysis and the area method of GPC.

The amount of the polymer (A0) containing structural units represented by the general formulae (1) and (2), and having an aromatic group having at least one alkyl group with 1 to 3 carbon atoms at least at one end in the resin composition for encapsulating a semiconductor is preferably not less than 0.5% by mass, more preferably not less than 1% by mass, and further preferably not less than 1.5% by mass, based on the total mass of the resin composition for encapsulating a semiconductor. When the lower limit is within the above range, the obtained resin composition has excellent flowability. Furthermore, the amount of the phenol resin (A) contained in the resin composition for encapsulating a semiconductor is preferably not more than 10% by mass, more preferably not more than 9% by mass, and further preferably not more than 8% by mass, based on the total mass of the resin composition for encapsulating a semiconductor. When the upper limit is within the above range, the obtained resin composition has excellent solder resistance.

In the resin composition for encapsulating a semiconductor of the present invention, other curing agent may be used together in the ranges in which an effect from the use of the above phenol resin (A) is not damaged. Examples of the curing agent which may be used together include a polyaddition type curing agent, a catalyst type curing agent, a condensation type curing agent and the like. Examples of the polyaddition type curing agent include polyamine compounds containing dicyandiamide (DICY), organic dihydrazide and the like; acid anhydrides containing alicyclic anhydride such as hexahydrophthalic anhydride (HHPA), methyl tetrahydrophthalic anhydride (MTHPA) and the like, aromatic acid anhydride such as trimellitic anhydride (TMA), pyromellitic anhydride (PMDA), benzophenonetetracarboxylic acid (BTDA) and the like; polyphenol compounds such as a novolac type phenol resin, a phenol polymer and the like; polymercaptan compounds such as polysulfide, thioester, thioether and the like; isocyanate compounds such as isocyanate prepolymer, blocked isocyanate and the like; and organic acids such as a carboxylic acid-containing polyester resin and the like, in addition to aliphatic polyamines such as diethylenetriamine (DETA), triethylenetetramine (TETA), meta-xylene diamine (MXDA) and the like, and aromatic polyamines such as diaminodiphenyl sulfone (DDM), m-phenylene diamine (MPDA), diaminodiphenyl sulfone (DDS) and the like.

Examples of the catalyst type curing agent include tertiary amine compounds such as benzyldimethylamine (BDMA), 2,4,6-trisdimethylaminomethylphenol (DMP-30) and the like; imidazole compounds such as 2-methylimidazole, 2-ethyl-4-methylimidazole (EMI24) and the like; and Lewis acids such as BF3 complex and the like.

Examples of the condensation type curing agent include phenol resin type curing agents such as a novolac type phenol resin, a resol type phenol resin and the like; urea resins such as methylol group-containing urea resins; and melamine resins such as methylol group-containing melamine resins.

Among these, preferably used is a phenol resin type curing agent from the viewpoint of a balance of flame resistance, moisture resistance, electrical properties, curability, storage stability and the like. The phenol resin type curing agent may generally be monomers, oligomers, or polymers having two or more phenolic hydroxyl groups in the molecule. The molecular weight and molecular structure thereof are not particularly restricted, and examples include novolac type resins such as a phenol novolac resin, a cresol novolac resin, a naphthol novolac resin and the like; polyfunctional phenol resins such as a triphenolmethane type phenol resin and the like; modified phenol resins such as a terpene-modified phenol resin, a dicyclopentadiene-modified phenol resin and the like; aralkyl type resins such as a phenol aralkyl resin having a phenylene skeleton and/or a biphenylene skeleton, a naphthol aralkyl resin having a phenylene skeleton and/or a biphenylene skeleton and the like; and bisphenol compounds such as bisphenol A, bisphenol F and the like. These compounds may be used singly or may be used in combination of two or more kinds. Among these, the hydroxyl equivalent is preferably from 90 to 250 g/eq from the viewpoint of curability.

When the other curing agent is used together, the mixing ratio of the phenol resin (A) containing structural units represented by the general formulae (1) and (2), and having an aromatic group having at least one alkyl group with 1 to 3 carbon atoms at least at one end is preferably not less than 15% by mass, more preferably not less than 25% by mass, and particularly preferably not less than 35% by mass, based on the total curing agent. When the mixing ratio is within the above range, an effect of improving flame resistance and solder resistance while maintaining excellent flowability and curability may be obtained. Furthermore, from the viewpoint of combining flowability, curability and flame resistance, it may be 100% by mass.

The lower limit of the mixing ratio of the total curing agent is not particularly limited, but it is preferably not less than 0.8% by mass and more preferably not less than 1.5% by mass in the total resin composition. When the lower limit of the mixing ratio is within the above range, sufficient flowability may be obtained. On the other hand, the upper limit of the mixing ratio of the total curing agent is not particularly limited, but it is preferably not more than 10% by mass and more preferably not more than 8% by mass in the total resin composition. When the upper limit of the mixing ratio is within the above range, excellent solder resistance may be obtained.

Examples of the epoxy resin (B) used for the resin composition for encapsulating a semiconductor of the present invention include crystalline epoxy resins such as a biphenyl type epoxy resin, a bisphenol type epoxy resin, a stilbene type epoxy resin, an anthracenediol type epoxy resin and the like; novolac type epoxy resins such as a phenol novolac type epoxy resin, a cresol novolac type epoxy resin and the like; polyfunctional epoxy resins such as a triphenol methane type epoxy resin, an alkyl-modified triphenol methane type epoxy resin and the like; aralkyl type epoxy resins such as a phenol aralkyl type epoxy resin having a phenylene skeleton, a phenol aralkyl type epoxy resin having a biphenylene skeleton, a naphthol aralkyl type epoxy resin having a phenylene skeleton and the like; naphthol type epoxy resins such as a dihydroxy naphthalene type epoxy resin, an epoxy resin obtained by glycidyl etherification of dimers of dihydroxy naphthalene and the like; novolac type epoxy resins having a methoxynaphthalene skeleton; triazine nucleus-containing epoxy resins such as triglycidyl isocyanurate, monoallyl diglycidyl isocyanurate and the like; and bridged cyclic hydrocarbon compound-modified phenol type epoxy resins such as a dicyclopentadiene-modified phenol type epoxy resin and the like, but are not restricted thereto. In view of moisture-resistant reliability of the resulting resin composition for encapsulating a semiconductor, the contents of $Na^+$ ion and $Cl^{31}$ ion, which are ionic impurities, contained in the epoxy resins are preferably not contained as much as possible. Also, from the viewpoint of the curability of the semiconductor resin composition, the epoxy equivalent of the epoxy resin (B) is preferably from 100 to 500 g/eq.

Among these, in view of flowability, preferably used are a biphenyl type epoxy resin, a bisphenol type epoxy resin and the like. In view of solder resistance, preferably used are a phenol aralkyl type epoxy resin having a phenylene skeleton, a phenol aralkyl type epoxy resin having a biphenylene skeleton, a novolac type epoxy resin having a methoxynaphthalene skeleton and the like. Furthermore, from the viewpoint of low-warping properties in a semiconductor device for encapsulating one surface, preferably used are a triphenol methane type epoxy resin, a naphthol aralkyl type epoxy resin having a phenylene skeleton, an anthracenediol type epoxy resin and the like. As shown in Examples to be described below, by using such an epoxy resin (B) in combination with the phenol resin (A) of the present invention, there is obtained an operational effect of bringing stably excellent balance of handling properties, solder resistance, flame resistance and continuous molding property while improving flowability.

Incidentally, it is preferable that the phenol resin (A) and the epoxy resin (B) are mixed such that the equivalent ratio (EP)/(OH) of the number of epoxy groups (EP) in the overall epoxy resin (B) to the number of phenolic hydroxyl groups (OH) of the overall phenol resin (A) is from 0.8 to 1.3. When the equivalent ratio is within the above range, sufficient curing properties may be obtained in molding the obtained resin composition.

As the inorganic filler (C) used for the resin composition for encapsulating a semiconductor of the present invention, inorganic fillers (C) which are generally used in the related field may be used. Examples thereof include fused silica, spherical silica, crystalline silica, alumina, silicon nitride, aluminum nitride and the like. The particle diameter of the inorganic filler (C) is preferably from 0.01 to 150 um from the viewpoint of filling properties into the mold cavity.

The amount of the inorganic filler (C) contained in the resin composition for encapsulating a semiconductor is preferably not less than 80% by mass, more preferably not less than 83% by mass, and further preferably not less than 86% by mass, based on the total mass of the resin composition for encapsulating a semiconductor. When the lower limit is within the above range, an increase in the amount of moisture absorption during curing of the obtained resin composition and deterioration of strength may be lowered, and accordingly a cured product having excellent soldering crack resistance may be obtained. Furthermore, the amount of the inorganic filler (C) in the resin composition for encapsulating a semiconductor is preferably not more than 93% by mass, more preferably not more than 91% by mass, and further preferably not more than 90% by mass, based on the total mass of the resin composition for encapsulating a semiconductor. When the upper limit is within the above range, the obtained resin composition has both excellent flowability and excellent molding property.

Incidentally, as described below, when metal hydroxide such as aluminum hydroxide, magnesium hydroxide or the like, or an inorganic flame retardant such as zinc borate, zinc molybdate, antimony trioxide or the like is used, the total amount of the inorganic flame retardant and the above-stated inorganic filler (C) is preferably within the above range.

The resin composition for encapsulating a semiconductor of the present invention may contain a curing accelerator (D). The curing accelerator (D) may be any compound which can accelerate a reaction between an epoxy group in the epoxy resin (B) and a hydroxyl group in the phenol resin (A), and may be selected from those curing accelerators commonly used. Specific examples include phosphorous-containing compounds such as organophosphine, a tetra-substituted phosphonium compound, a phosphobetaine compound, an adduct of a phosphine compound and a quinone compound, an adduct of a phosphonium compound and a silane compound and the like; and nitrogen-containing compounds such as 8-diazabicyclo(5,4,0)undecene-7, benzyldimethylamine, 2-methylimidazole and the like. Among these, preferably used are phosphorous-containing compounds in view of curability, and more preferably used are catalysts having latency such as a tetra-substituted phosphonium compound, a phosphobetaine compound, an adduct of a phosphine compound and a quinone compound, an adduct of a phosphonium compound and a silane compound and the like in view of a balance between flowability and curability. In consideration of flowability, particularly preferably used is a tetra-substituted phosphonium compound. In consideration of low elastic modulus during heating of a cured product of the resin composition, particularly used are a phosphobetaine compound, and an adduct of a phosphine compound and a quinone compound. Furthermore, in consideration of the latent curability, particularly preferably used is an adduct of a phosphonium compound and a silane compound.

Examples of the organic phosphines which may be used for the resin composition for encapsulating a semiconductor of the present invention include primary phosphines such as ethylphosphine, phenylphosphine and the like; secondary phosphines such as dimethylphosphine, diphenylphosphine and the like; and tertiary phosphines such as trimethylphosphine, triethylphosphine, tributylphosphine, triphenylphosphine and the like.

Examples of the tetra-substituted phosphonium compound which may be used for the resin composition for encapsulating a semiconductor of the present invention include compounds represented by the following general formula (6),

[Chemical Formula 18]

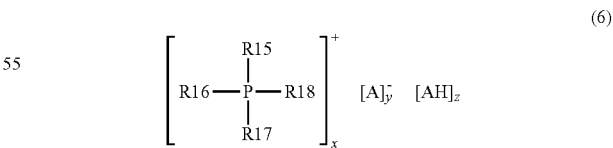

wherein, in the general formula (6), P represents a phosphorus atom; R15, R16, R17 and R18 each independently represent an aromatic group or an alkyl group; A represents an anion of an aromatic organic acid in which at least one functional group selected from a hydroxyl group, a carboxyl group and a thiol group is bonded to an aromatic ring; AH represents an aromatic organic acid in which at least one functional group selected from a hydroxyl group, a carboxyl group and a thiol group is bonded to an aromatic ring; x and y are each an integer of 1 to 3; z is an integer of 0 to 3; and x=y.

The compound represented by the general formula (6) is obtained by the following manner, but the method is not restricted thereto. First, a tetra-substituted phosphonium halide, an aromatic organic acid and a base are added to an organic solvent and uniformly mixed to produce an aromatic organic acid anion in the solution system. Subsequently, water is added to the solution, and thus, the compound represented by general formula (6) may be precipitated. In the compound represented by general formula (6), from the viewpoint of excelling in a balance between the yielding rate and curing acceleration at the time of synthesis, R15, R16, R17 and R18 bonded to a phosphorus atom are each preferably a phenyl group, and AH is preferably a compound in which a hydroxyl group is bonded to an aromatic ring, i.e., a phenol compound, and A is preferably an anion of the phenol compound.

Examples of the phosphobetaine compound which may be used for the resin composition for encapsulating a semiconductor of the present invention include compounds represented by the following general formula (7),

[Chemical Formula 19]

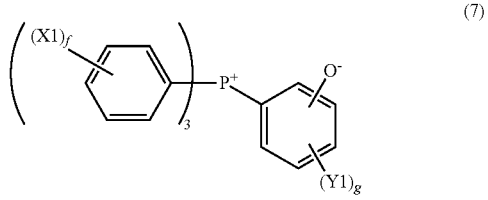

(7)

wherein, in the general formula (7), X1 represents an alkyl group having 1 to 3 carbon atoms; Y1 represents a hydroxyl group; f is an integer of 0 to 5; and g is an integer of 0 to 3.

The compound represented by the general formula (7) is obtained, for example, in the following manner. First, it is obtained through a step in which a triaromatic-substituted phosphine, which is a tertiary phosphine, is brought into contact with a diazonium salt to substitute the triaromatic-substituted phosphine and a diazonium group of the diazonium salt. However, the method is not limited to this.

Examples of the adduct of a phosphine compound and a quinone compound which may be used for the resin composition for encapsulating a semiconductor of the present invention include compounds represented by the following general formula (8),

[Chemical Formula 20]

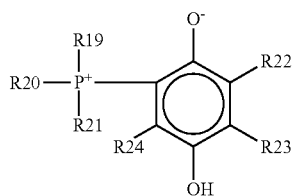

(8)

wherein, in the general formula (8), P represents a phosphorus atom; R19, R20 and R21 each independently represent an alkyl group having 1 to 12 carbon atoms or an aryl group having 6 to 12; R22, R23 and R24 each independently represent a hydrogen atom or a hydrocarbon group having 1 to 12 carbon atoms; and R22 and R23 may be bonded to each other to form a ring.

Preferable examples of the phosphine compound used for the adduct of a phosphine compound and a quinone compound include unsubstituted aromatic ring-containing phosphines such as triphenylphosphine, tris(alkylphenyl)phosphine, tris(alkoxyphenyl)phosphine, trinaphthylphosphine, tris(benzyl)phosphine and the like; and phosphines containing an aromatic ring substituted with an alkyl group or an alkoxy group. Examples of the alkyl group and the alkoxy group include alkyl groups having 1 to 6 carbon atoms. From the standpoint of availability, triphenylphosphine is preferred.

Examples of the quinone compound used for the adduct of a phosphine compound and a quinone compound include o-benzoquinone p-benzoquinone and anthraquinones. Among these, p-benzoquinone is preferred from the standpoint of storage stability.

In a method of producing an adduct of a phosphine compound and a quinone compound, an organic tertiary phosphine is brought into contact with a benzoquinone in a solvent that can dissolve both the organic tertiary phosphine and the benzoquinone, and mixed to produce an adduct thereof. Any solvent can be used as long as the solubility into the adduct is low. Examples of the solvent include ketones such as acetone and methyl ethyl ketone, but are not limited thereto.

In the compound represented by the general formula (8), R19, R20 and R21, all of which are bonded to a phosphorus atom, are each preferably a phenyl group, and R22, R23 and R24 are each a hydrogen atom. That is, a compound produced by adding 1,4-benzoquinone to triphenylphosphine is preferable because the compound decreases the elastic modulus during heating of a cured product of the resin composition.

Examples of the adduct of a phosphonium compound and a silane compound which may be used for the resin composition for encapsulating a semiconductor of the present invention include compounds represented by the following formula (9),

[Chemical Formula 21]

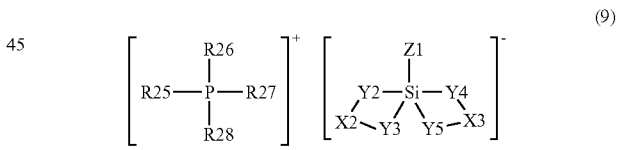

(9)

wherein, in the general formula (9), P represents a phosphorus atom; Si represents a silicon atom; R25, R26, R27 and R28 each independently represent an organic group having an aromatic ring or a heterocyclic ring, or an aliphatic group; X2 is an organic group that bonds group Y2 to group Y3; X3 is an organic group that bonds group Y4 to group Y5; Y2 and Y3 each represent a group formed when a proton-donating group releases a proton, and group Y2 and group Y3 in the same molecule are linked with the silicon atom to form a chelate structure; Y4 and Y5 each represent a group formed when a proton-donating group releases a proton, and group Y4 and group Y5 in the same molecule are linked with the silicon atom to form a chelate structure; X2 and X3 may be the same or different from each other; Y2, Y3, Y4 and Y5 may be the same or different from each other; and Z1 is an organic group having an aromatic ring or a heterocyclic ring, or an aliphatic group.

Examples of R25, R26, R27 and R28 in the general formula (9) include a phenyl group, a methylphenyl group, a methoxyphenyl group, a hydroxyphenyl group, a naphthyl group, a hydroxynaphthyl group, a benzyl group, a methyl group, an ethyl group, an n-butyl group, an n-octyl group, a cyclohexyl group and the like. Among these, more preferably used are aromatic groups having a substituent or unsubstituted aromatic groups such as a phenyl group, a methylphenyl group, a methoxyphenyl group, a hydroxyphenyl group, a hydroxynaphthyl group and the like.

Furthermore, in the general formula (9), X2 is an organic group that bonds group Y2 to group Y3. Similarly, X3 is an organic group that bonds Y4 to Y5. Y2 and Y3 are each a group formed when a proton-donating group releases a proton, and group Y2 and group Y3 in the same molecule are linked with the silicon atom to form a chelate structure. Similarly, Y4 and Y5 are each a group formed when a proton-donating group releases a proton, and group Y4 and group Y5 in the same molecule are linked with the silicon atom to form a chelate structure. The group X2 and group X3 may be the same or different from each other, and group Y2, group Y3, group Y4, and group Y5 may be the same or different from one another. The group represented by —Y2-X2-Y3- and the group represented by Y4-X3-Y5- in the general formula (9) are each a group formed when a proton donor releases two protons. Examples of the proton donor include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol, glycerin and the like. Among these, more preferably used are catechol, 1,2-dihydroxynaphthalene and 2,3-dihydroxynaphthalene in view of a balance between availability of a raw material and curing acceleration.

Furthermore, in the general formula (9), Z1 represents an organic group having an aromatic ring or a heterocyclic ring, or an aliphatic group. Specific examples of Z1 include aliphatic hydrocarbon groups such as a methyl group, an ethyl group, a propyl group, a butyl group, a hexyl group, an octyl group and the like; aromatic hydrocarbon groups such as a phenyl group, a benzyl group, a naphthyl group, a biphenyl group and the like; and reactive substituents such as a glycidyloxypropyl group, a mercaptopropyl group, an aminopropyl group, a vinyl group and the like. Among these, more preferably used are a methyl group, an ethyl group, a phenyl group, a naphthyl group and a biphenyl group from the viewpoint of thermal stability.

In a method of producing an adduct of a phosphonium compound and a silane compound, a silane compound such as phenyltrimethoxysilane and a proton donor such as 2,3-dihydroxynaphthalene are added to methanol in a flask and dissolved. Next, a sodium methoxide-methanol solution is added dropwise thereto under stirring at room temperature. A solution prepared by dissolving a tetra-substituted phosphonium halide such as tetraphenyl phosphonium bromide in methanol in advance is added to the resulting reaction product dropwise under stirring at room temperature to precipitate crystals. The precipitated crystals are filtered, washed with water, and then dried in vacuum. Thus, an adduct of a phosphonium compound and a silane compound is obtained. However, the method is not limited to this.

The lower limit of the mixing ratio of the curing accelerator (D) which may be used for the resin composition for encapsulating a semiconductor of the present invention is preferably not less than 0.1% by mass in the total resin composition. When the lower limit of the mixing ratio of the curing accelerator (D) is within the above range, sufficient curability may be achieved. On the other hand, the upper limit of the mixing ratio of the curing accelerator (D) is preferably not more than 1% by mass in the total resin composition. When the upper limit of the mixing ratio of the curing accelerator (D) is within the above range, sufficient flowability may be achieved.

In the present invention, a compound (E) in which a hydroxyl group is bonded to each of two or more adjacent carbon atoms constituting an aromatic ring (hereinafter referred to as the compound (E)) may be further used. The compound (E) in which a hydroxyl group is bonded to each of two or more adjacent carbon atoms constituting an aromatic ring is used as a curing accelerator for accelerating a crosslinking reaction between the phenol resin (A) and the epoxy resin (B). Even when a phosphorus atom-containing curing accelerator without having latency is used, the reaction of the resin composition during the melt-kneading may be suppressed with the use of the compound (E), so that a stable resin composition may be obtained. Furthermore, the compound (E) also has an effect of decreasing the melt viscosity of the resin composition and increasing flowability. Examples of the compound (E) include a monocyclic compound represented by the following general formula (10), a polycyclic compound represented by the following general formula (11) and the like, and these compounds may have a substituent other than a hydroxyl group,

[Chemical Formula 22]

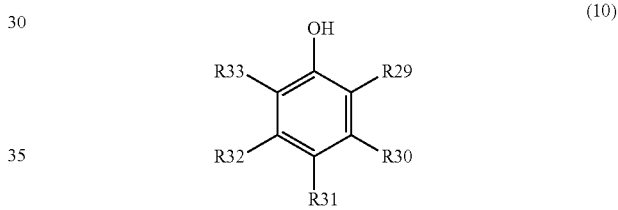

(10)

wherein, in the general formula (10), when any one of R29 and R33 is a hydroxyl group, the other of R29 and R33 is a hydrogen atom, a hydroxyl group or a substituent other than a hydroxyl group; and R30, R31 and R32 are each independently a hydrogen atom, a hydroxyl group or a substituent other than a hydroxyl group,

[Chemical Formula 23]

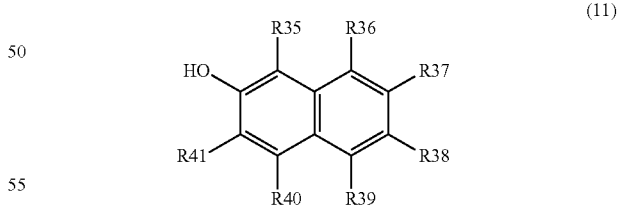

(11)

wherein, in the general formula (11), when any one of R35 and R41 is a hydroxyl group, the other of R35 and R41 a hydrogen atom, a hydroxyl group or is a substituent other than a hydroxyl group; and R36, R37, R38, R39 and R40 are each independently a hydrogen atom, a hydroxyl group or a substituent other than a hydroxyl group.

Concrete examples of the monocyclic compound represented by the general formula (10) include catechol, pyrogallol, gallic acid, gallic acid esters and their derivatives. Concrete examples of the polycyclic compound represented by the general formula (11) include 1,2-dihydroxy naphthalene, 2,3-dihydroxy naphthalene and their derivatives. Among these, from the viewpoint of ease of control of flowability and curability, preferably used is a compound in which a hydroxyl group is bonded to each of two or more adjacent carbon atoms constituting an aromatic ring. Furthermore, in consideration of volatilization in a step of kneading, more preferably used is a compound having, as a mother nucleus, a naphthalene ring, which has low volatility and high weighing stability. In this case, the compound (E), may be specifically, for example, a compound having a naphthalene ring such as 1,2-dihydroxy naphthalene, 2,3-dihydroxy naphthalene and their derivatives. These compounds (E) may be used singly or may be used in combination of two or more kinds.

The lower limit of the mixing ratio of the compound (E) is preferably not less than 0.01% by mass, more preferably not less than 0.03% by mass, and particularly preferably not less than 0.05% by mass, based on the total resin composition. When the lower limit of the mixing ratio of the compound (E) is within the above range, sufficiently low viscosity and improvement of flowability of the resin composition may be obtained. Furthermore, the upper limit of the mixing ratio of the compound (E) is preferably not more than 1% by mass, more preferably not more than 0.8% by mass, and particularly preferably not more than 0.5% by mass, based on the total resin composition. When the upper limit of the mixing ratio of the compound (E) is within the above range, a decrease in curability and a degradation of physical properties of a cured product of the resin composition may not easily occur.

In the resin composition for encapsulating a semiconductor of the present invention, for the purpose of improving adhesion between the epoxy resin (B) and the inorganic filler (C), a coupling agent (F) may be used. As the coupling agent (F), for example, an adhesion auxiliary agent such as a silane coupling agent or the like may be added. The coupling agent is not particularly limited, and examples thereof include epoxysilane, aminosilane, ureidosilane, mercaptosilanen and the like, and it may be any one which can be reacted between an epoxy resin and an inorganic filler to improve the interfacial strength between the epoxy resin and the inorganic filler. Furthermore, when the silane coupling agent may be used together with the above-stated compound (E), the silane coupling agent enhances the effect that the compound (E) reduces the melt viscosity of the resin composition and improves flowability.

Examples of the epoxysilane include γ-glycidoxypropyltriethoxysilane, γ-glycidoxypropyltrimethoxysilane, γ-glycidoxypropylmethyldimethoxysilane, β-(3,4-epoxycyclohexyl)ethyltrimethoxysilane and the like. Examples of the aminosilane include γ-aminopropyltriethoxysilane, γ-aminopropyltrimethoxysilane, N-β(aminoethyl)γ-aminopropyltrimethoxysilane, N-β(aminoethyl)γ-aminopropylmethyldimethoxysilane, N-phenylγ-aminopropyltriethoxysilane, N-phenylγ-aminopropyltrimethoxysilane, N-β(aminoethyl)γ-aminopropyltriethoxysilane, N-6-(aminohexyl)-3-aminopropyltrimethoxysilane, N-(3-(trimethoxysilylpropyl)-1,3-benzenedimethanane and the like. Examples of the ureidosilane include γ-ureidopropyltriethoxysilane, hexamethyldisilazane and the like. Examples of the mercaptosilane include γ-mercaptopropyltrimethoxysilane and the like. These silane coupling agents may be used singly or may be used in combination of two or more kinds.

The lower limit of the mixing ratio of the adhesion auxiliary agent such as a silane coupling agent or the like which may be used for the resin composition for encapsulating a semiconductor of the present invention is preferably not less than 0.01% by mass, more preferably not less than 0.05% by mass, and particularly preferably not less than 0.1% by mass, based on the total resin composition. When the lower limit of the mixing ratio of the adhesion auxiliary agent such as a silane coupling agent or the like is within the above range, excellent soldering crack resistance in the semiconductor device may be obtained without lowering the interfacial strength between the epoxy resin and the inorganic filler. Furthermore, the upper limit of the mixing ratio of the adhesion auxiliary agent such as a silane coupling agent or the like is preferably not more than 1% by mass, more preferably not more than 0.8% by mass, and particularly preferably not more than 0.6% by mass, based on the total resin composition. When the upper limit of the mixing ratio of the adhesion auxiliary agent such as a silane coupling agent or the like is within the above range, excellent soldering crack resistance in the semiconductor device may be obtained without lowering the interfacial strength between the epoxy resin and the inorganic filler. Also, when the mixing ratio of the adhesion auxiliary agent such as a silane coupling agent or the like is within the above range, excellent soldering crack resistance in the semiconductor device may be obtained without increasing moisture absorption of the cured product of the resin composition.

The resin composition for encapsulating a semiconductor of the present invention, in addition to the aforementioned components, may further properly contain additives, for example, a coloring agent such as carbon black, bengala, titanium oxide or the like; releasing agents such as natural waxes, for example, carnauba wax and the like, synthetic waxes, for example, polyethylene wax and the like, higher fatty acids and metal salts thereof, for example, stearic acid, zinc stearate and the like, and paraffins; low-stress additives such as silicone oils, silicone rubbers and the like; inorganic ion-exchangers such as bismuth oxide hydrate and the like; metal hydroxides such as aluminum hydroxide, magnesium hydroxide and the like; and inorganic flame retardants such as zinc borate, zinc molybdate phosphazene, antimony trioxide and the like.

The resin composition for encapsulating a semiconductor of the present invention may be prepared by homogeneously mixing the phenol resin (A), the epoxy resin (B), the inorganic filler (C), and the above-stated other additive at room temperature using a mixer or the like, and thereafter, as necessary, melt-kneading the homogenous mixture using a kneading machine such as a hot roller, a kneader or an extruder, and then cooling and pulverizing the mixture as necessary. The composition may be prepared to have desirable dispersibility and flowability.

Next, the semiconductor device of the present invention will be described. In a method of producing a semiconductor device using the resin composition for encapsulating a semiconductor of the present invention, for example, a lead frame or a circuit board on which a semiconductor element is mounted is placed in a mold cavity, and then the resin composition for encapsulating a semiconductor is molded by a molding method such as transfer molding, compression molding, injection molding or the like and is cured in the mold, whereby the semiconductor element is encapsulated.

Examples of the semiconductor element to be encapsulated include integrated circuits, large scale integrated circuits, transistors, thyristors, diodes, solid-state image sensing devices and the like, but are not restricted thereto.

Examples of package of the obtained semiconductor device include dual inline packages (DIPs), plastic leaded chip carriers (PLCCs), quad flat packages (QFPs), low-profile quad flat packages (LQFPs), small outline packages (SOPs), small outline J-lead packages (SOJs), thin small outline packages (TSOPs), thin quad flat packages (TQFPs), tape carrier packages (TCPs), ball grid arrays (BGAs), chip size packages (CSPs) and the like, but are not restricted thereto.

The semiconductor device in which a semiconductor element is sealed by a molding method such as transfer molding or the like of the resin composition for encapsulating a semiconductor may be mounted on any electronic apparatus without curing or after completely curing the resin composition at a temperature of about 80° C. to 200° C. over a period of about 10 minutes to 10 hours.

FIG. 1 is a cross-sectional view showing one example of a semiconductor device using a resin composition for encapsulating a semiconductor according to the present invention. A semiconductor element 1 is fixed on a die pad 3 via a cured die bond 2. The electrode pads of the semiconductor element 1 and lead frames 5 are connected by gold wires 4. The semiconductor element 1 is encapsulated with a cured product 6 of the resin composition for encapsulating a semiconductor.

EXAMPLES

Hereinafter, the present invention will be described in detail with reference to Examples. However, the present invention is not restricted to these Examples. In the following Examples, the proportion of each component is represented by "parts by mass" unless otherwise particularly noted.

Phenol Resin

Figure 2:
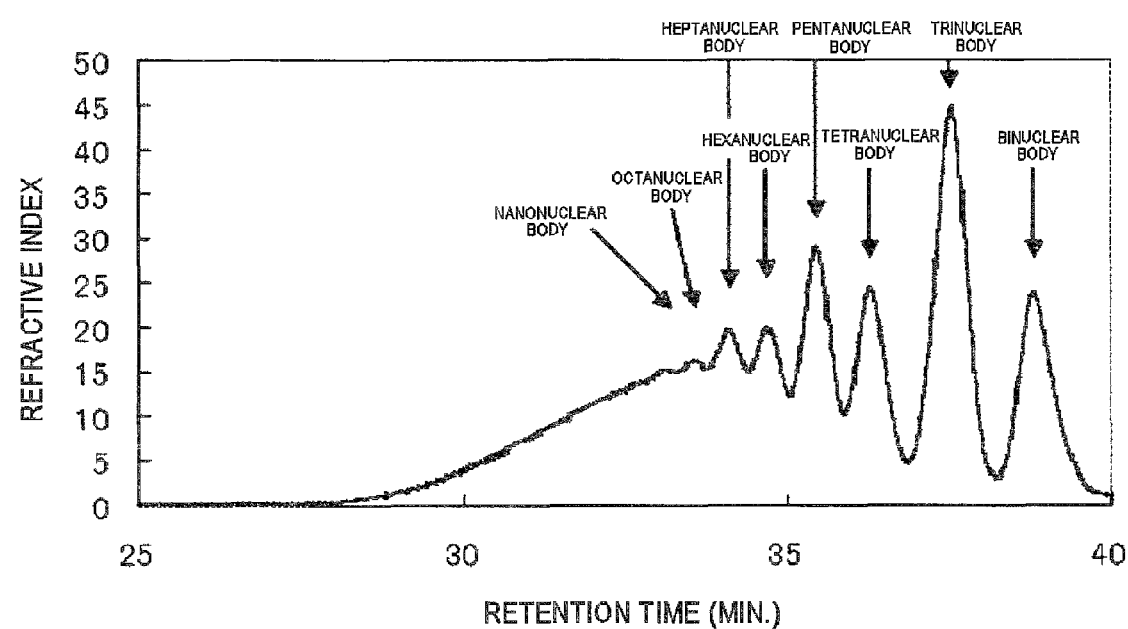
FIG. 2 is a GPC chart of a phenol resin 1.
Figure 3:
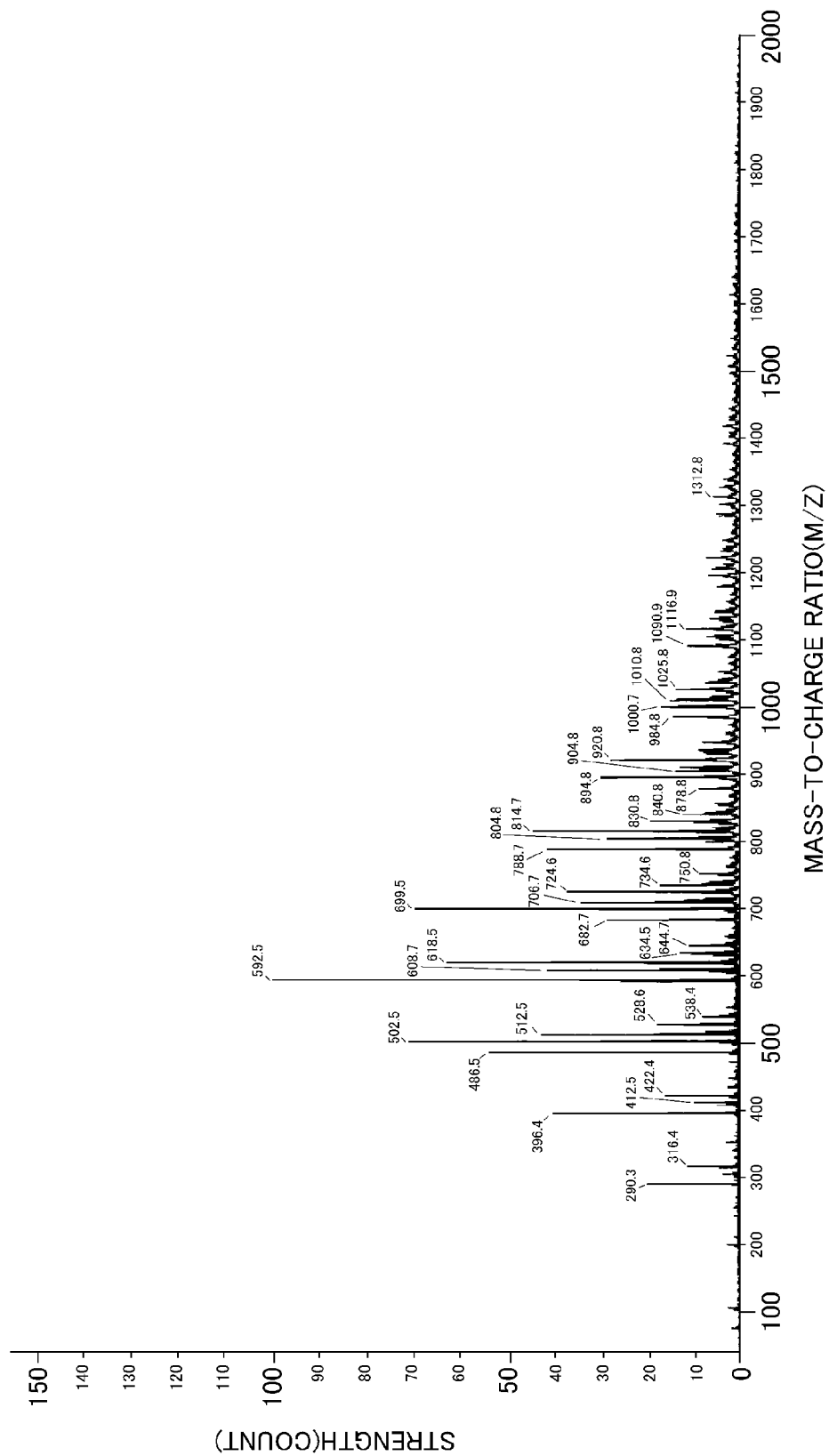
FIG. 3 is a FD-MS chart of a phenol resin 1.

Phenol resin 1: 100 parts by mass of phenol (phenol, a special grade reagent, manufactured by Kanto Kagaku, melting point: 40.9° C., molecular weight: 94, purity: 99.3%), 34.5 parts by mass of p-xylylene glycol (p-xylylene glycol, manufactured by Tokyo Chemical Industry, Co., Ltd., melting point: 118° C., molecular weight: 138, purity: 98%), and 0.5 parts by mass of p-toluenesulfonic acid monohydrate (p-toluenesulfonic acid, manufactured by Wako Pure Chemical Industries, Ltd., molecular weight: 190, purity: 99%) were weighed in a separable flask. While the flask was purged with nitrogen, the resulting mixture was heated and began to be stirred in association with initiation of melting. After it was confirmed that the temperature in the system reached 150° C., 13.5 parts by mass of a 37% aqueous formaldehyde solution (formalin 37%, manufactured by Wako Pure Chemical Industries, Ltd.) was added thereto over 30 minutes. The reaction was carried out for 90 minutes while maintaining the temperature in the system in the range of 145° C. to 155° C. Then, while 22.5 parts by mass of 1,3,5-trimethylbenzene (a Cica special grade reagent, manufactured by Tokyo Chemical Industry, Co., Ltd., boiling point: 165° C., molecular weight: 120, purity: 99%) was added into the system over 30 minutes, the temperature of the reaction system was lowered, and while the temperature range of 120° C. to 130° C. was maintained, the reaction was further carried out for 240 minutes. During the period between initiation of addition of the above-state formaldehyde and completion of the reaction, moisture generated in the system by the reaction or entrained into the system along with the addition of formalin was discharged out of the system by nitrogen flow. After completion of the reaction, the unreacted component was removed under reduced-pressure condition of 150° C., and 2 mmHg. Subsequently, 200 parts by mass of toluene was added, and the mixture was homogeneously dissolved, and then transferred to a separating funnel. After 150 parts by mass of distilled water was added thereto and shaken, an operation (water washing) to remove a water layer was repeatedly carried out until cleaning water became neutralized, and then an oil layer was depressurized at 125° C. to remove volatile components such as toluene, remained unreacted component and the like, whereby a phenol resin 1 (hydroxyl equivalent: 159, softening point: 67° C., ICI viscosity at 150° C.: 0.65 dPa·s) that is a mixture of polymers represented by the following formulae (12), (13) and (14) was obtained. GPC analysis and FD-MS analysis of the resulting phenol resin 1 were carried out and as a result, the mass ratios of polymers represented by the following formulae (12), (13) and (14) were respectively 63.2% by mass, 34.6% by mass and 2.2% by mass, while the mean values of a1 to a3 and b1 to b3 in the following formulae (12), (13) and (14) were a1=1.04, a2=0.94, a3=1.45, b1=0.92, b2=0.79 and b3=0.60. A GPC chart of the phenol resin 1 is shown in FIG. 2, while a FD-MS chart is shown in FIG. 3.

Incidentally, the mean values of a1 to a3 and b1 to b3 were measured in the following manner. First, the mass ratios of respective nuclei having aromatic rings of the same number were calculated by GPC analysis (area method) of the phenol resin 1. Subsequently, the molecular weight peak strength obtained by performing FD-MS analysis was proportional to the mass ratio of each compound of the formulae (12), (13) and (14) in respective nuclei, such that the mass ratios of respective compounds were calculated. Respective mean values of a1 to a3 and b1 to b3 were determined from the obtained molecular weights.

GPC measurement of the phenol resin 1 was carried out under the following conditions. To 20 mg of a sample of the phenol resin 1 was added 6 ml of a solvent tetrahydrofuran (THF), and the resulting mixture was fully dissolved and supplied for the GPC measurement. As a GPC system, there was used one in which a module W2695 manufactured by Waters Corporation, TSK GUARDCOLUMN HHR-L (diameter: 6.0 mm, tube length: 40 mm, guard column) manufactured by Tosoh Corporation, two of TSK-GEL GMHHR-L (diameter: 7.8 mm, tube length: 30 mm, polystyrene gel column) manufactured by Tosoh Corporation, and a differential refractive index (RI) detector W2414 manufactured by Waters Corporation were connected in series. The flow rate of the pump was set to 0.5 ml/min, the temperature in the column and the differential refractive index meter was set to 40° C., and 100 μl of a test solution was introduced from an injector to carryout GPC measurement.

FD-MS measurement of the phenol resin 1 was carried out under the following conditions. To 10 mg of a sample of the phenol resin 1 was added 1 g of a solvent dimethyl sulfoxide (DMSO), and the resulting mixture was fully dissolved, coated on the FD emitter, and then supplied for the FD-MS measurement. As a FD-MS system, there was used one obtained by connecting MS-FD15A manufactured by JEOL Ltd. to an ionization part and connecting MS-700 (model name, a double-focusing mass spectrometry device manufactured by JEOL Ltd.) to a detector to carry out the measurement in the detected mass range (m/z) of 50 to 2,000.

[Chemical Formula 24]

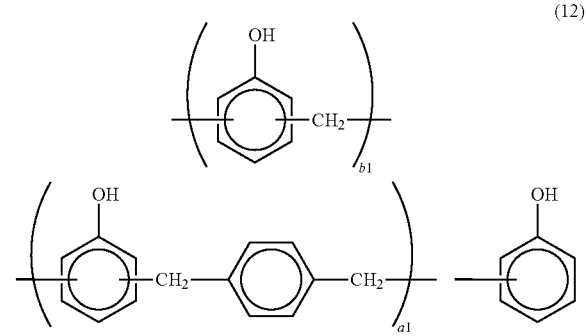

(12)

-continued

[Chemical Formula 25]

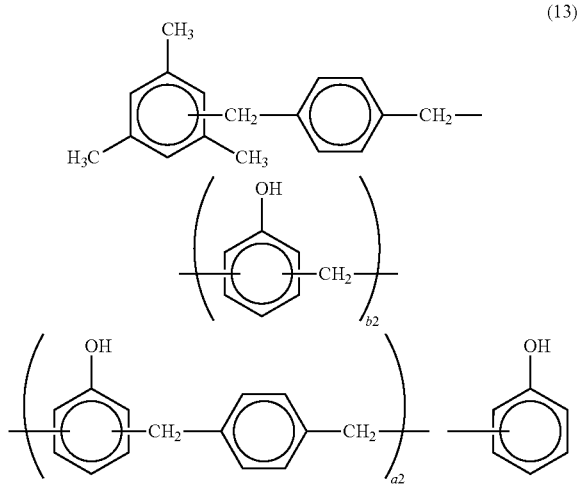

(13)

[Chemical Formula 26]

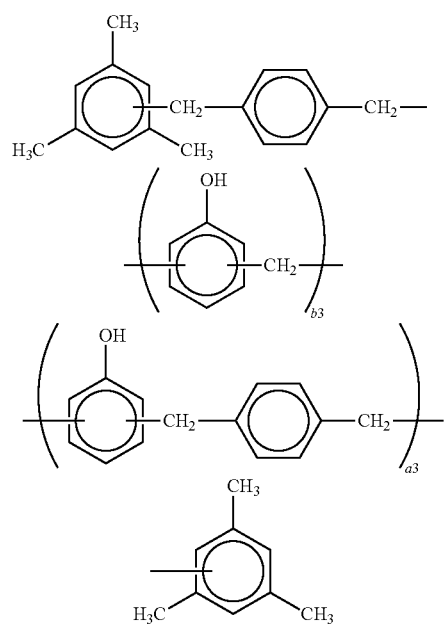

(14)

Figure 4:
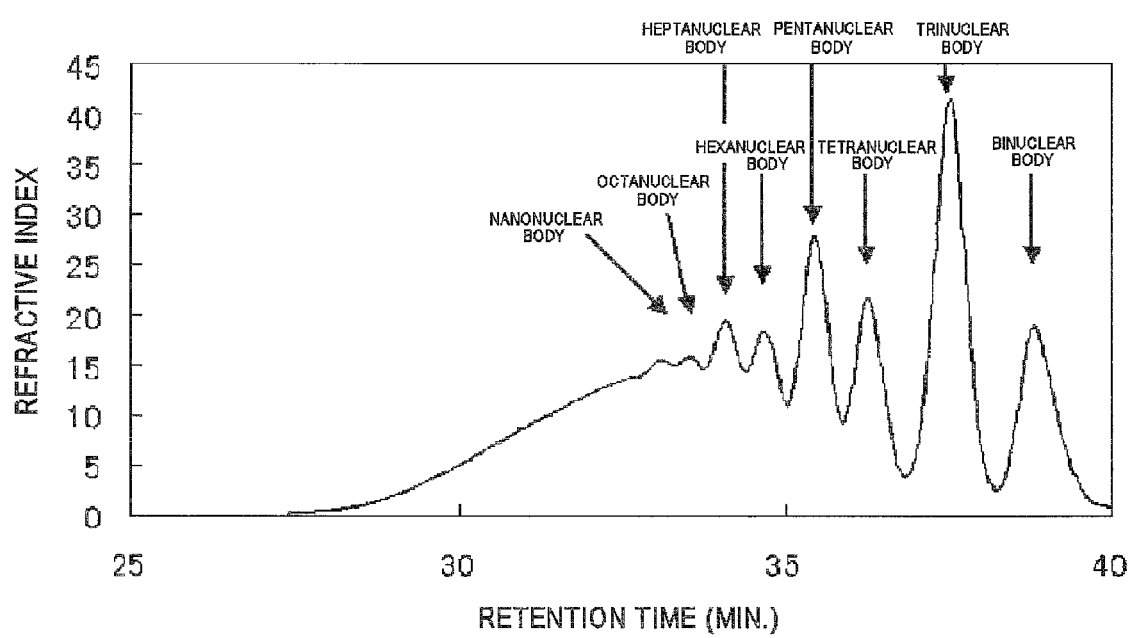
FIG. 4 is a GPC chart of a phenol resin 2.
Figure 5:
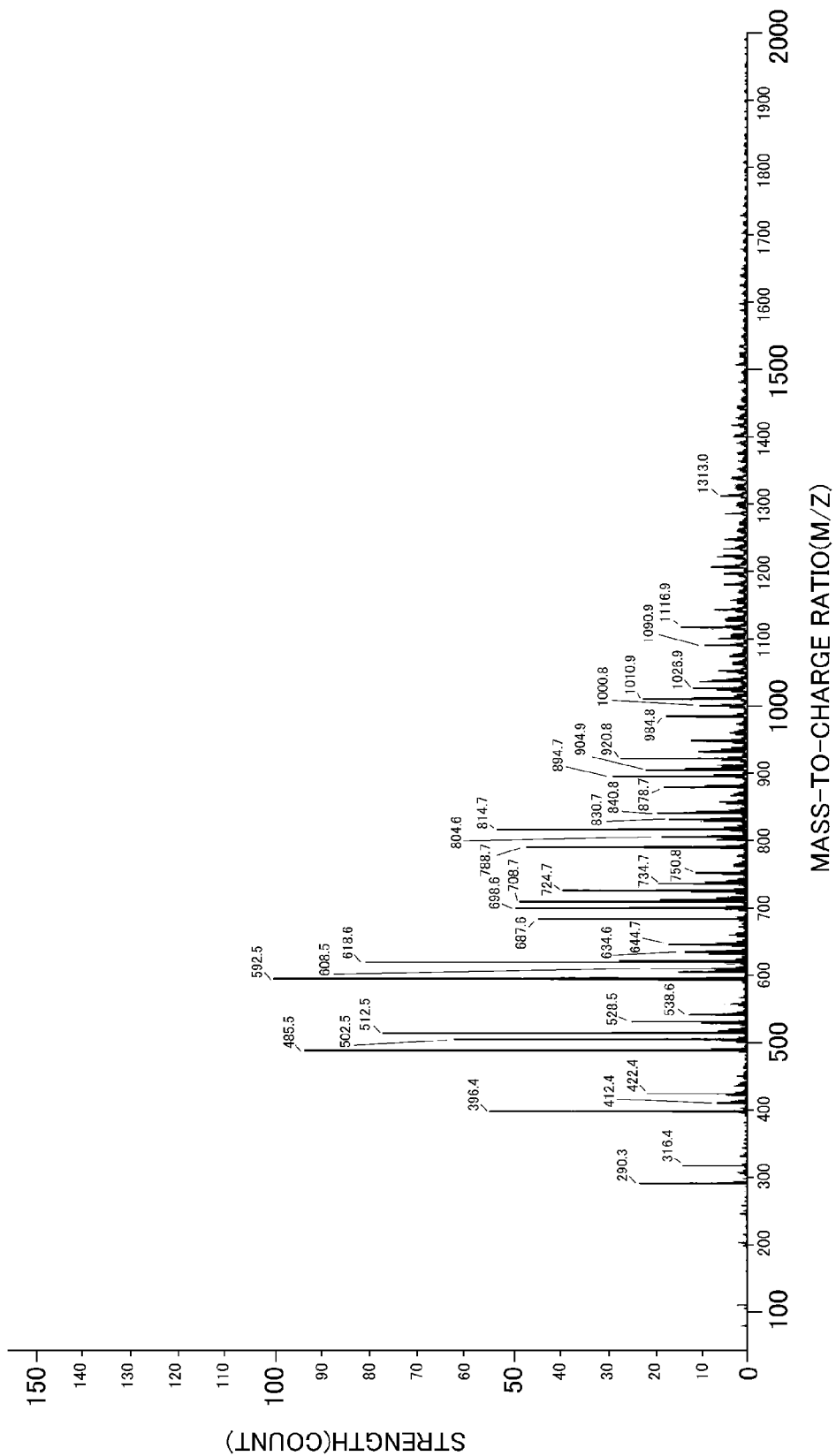
FIG. 5 is a FD-MS chart of a phenol resin 2.

Phenol resin 2: For the synthesis of the phenol resin 1, an operation was carried in the same manner as in the phenol resin 1, except for using 39.4 parts by mass of p-xylylene glycol (p-xylylene glycol, manufactured by Tokyo Chemical Industry, Co., Ltd., melting point: 118° C., molecular weight: 138, purity: 98%), 12.5 parts by mass of a 37% aqueous formaldehyde solution (formalin 37%, manufactured by Wako Pure Chemical Industries, Ltd.) and 1,2,4-trimethylbenzene (a Cica special grade reagent, manufactured by Tokyo Chemical Industry, Co., Ltd., boiling point: 170° C., molecular weight: 120, purity: 99%) instead of 1,3,5-trimethylbenzene, whereby a phenol resin (hydroxyl equivalent: 166, softening point: 68° C., ICI viscosity at 150° C.: 0.75 dPa·s) that is a mixture of polymers represented by the following formulae (15), (16) and (17) was obtained. In the same manner as in the phenol resin 1, GPC analysis and FD-MS analysis of the resulting phenol resin 2 were carried out and as a result, the mass ratios of polymers represented by the following formulae (15), (16) and (17) were respectively 61.4% by mass, 35.9% by mass and 2.7% by mass, while the mean values of a4 to a6 and b4 to b6 in the following formulae (15), (16) and (17) were a4=0.98, a5=0.91, a6=1.40, b4=0.80, b5=0.68 and b6=0.65. A GPC chart of the phenol resin 2 is shown in FIG. 4, while a FD-MS chart is shown in FIG. 5,

[Chemical Formula 27]

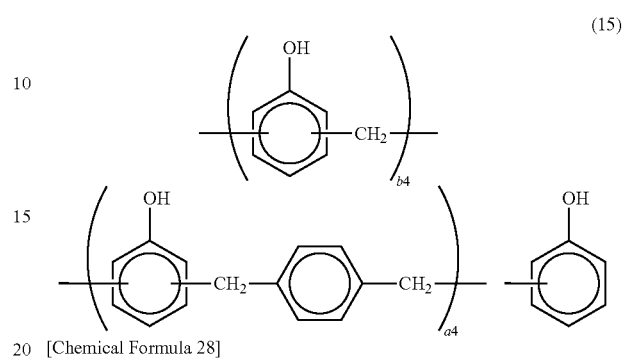

(15)

[Chemical Formula 28]

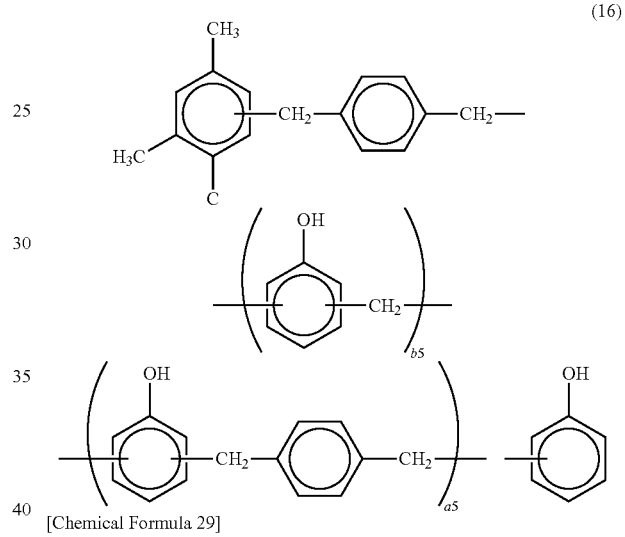

(16)

[Chemical Formula 29]

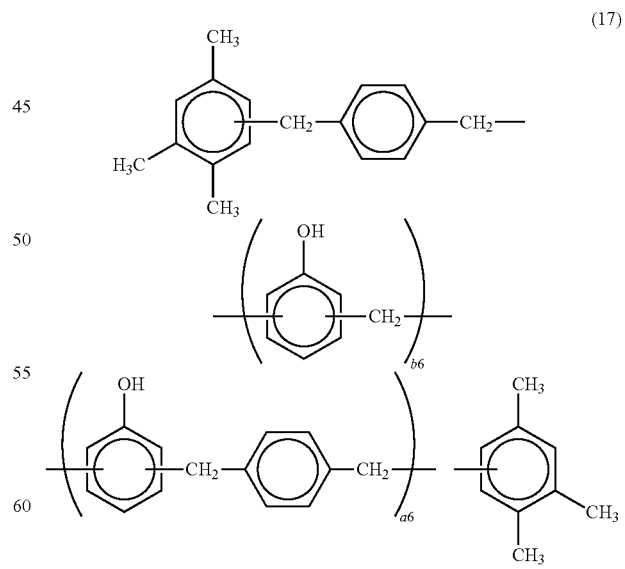

(17)

Furthermore, the results from FD-MS analysis and GPC analysis of the phenol resin 1 and the phenol resin 2 are shown in Table 1 below.

TABLE 1

FD-MS Analysis Results

| Molecular weight (m/z) | Information on Molecular Structure | | | | | Strength Ratio of Respective Peaks | |
|---|---|---|---|---|---|---|---|
| | Repeated No. of structural units of formula (1) | Repeated No. of structural units of formula (2) | No. of aromatic groups having alkyl group | Total No. of nuclei | Structure | Phenol resin 1 | Phenol resin 2 |
| 200 | 1 | 0 | 0 | 2 | Phenol novolac (PN) | Not more than lower limit of detection | |
| 290 | 0 | 1 | 0 | 3 | Phenol aralkyl (PA) | 1.94 | 1.93 |
| 316 | 0 | 1 | 1 | 3 | PA + aromatic group having alkyl group at one end | 1.06 | 1.10 |
| 396 | 1 | 1 | 0 | 4 | PA + PN copolymer | 3.99 | 4.60 |
| 412 | 3 | 0 | 0 | 4 | Phenol novolac (PN) | 0.82 | 0.55 |
| 422 | 1 | 1 | 1 | 4 | PA + PN + aromatic group having alkyl group at one end | 1.53 | 1.75 |
| 486 | 0 | 2 | 0 | 5 | Phenol aralkyl (PA) | 5.28 | 7.81 |
| 502 | 2 | 1 | 0 | 5 | PA + PN | 7.05 | 5.15 |
| 512 | 0 | 2 | 1 | 5 | PA + PN + aromatic group having alkyl group at one end | 4.23 | 6.43 |
| 528 | 2 | 1 | 1 | 5 | PA + PN + aromatic group having alkyl group at one end | 1.70 | 2.02 |
| 538 | 0 | 2 | 2 | 5 | PA + aromatic group having alkyl group at both ends | 0.70 | 1.01 |
| 592 | 1 | 2 | 0 | 6 | PA + PN copolymer | 9.86 | 8.27 |
| 608 | 3 | 1 | 0 | 6 | PA + PN copolymer | 4.11 | 2.67 |
| 618 | 1 | 2 | 1 | 6 | PA + PN + aromatic group having alkyl group at one end | 6.22 | 6.71 |
| 634 | 3 | 1 | 1 | 6 | PA + PN + aromatic group having alkyl group at one end | 1.17 | 0.83 |
| 644 | 1 | 2 | 2 | 6 | PA + PN + aromatic group having alkyl group at both ends | 1.06 | 1.38 |
| 682 | 0 | 3 | 0 | 7 | Phenol aralkyl (PA) | 2.82 | 3.68 |
| 698 | 2 | 2 | 0 | 7 | PA + PN copolymer | 6.93 | 4.14 |
| 708 | 0 | 3 | 1 | 7 | PA + aromatic group having alkyl group at one end | 3.35 | 3.95 |
| 724 | 2 | 2 | 1 | 7 | PA + PN + aromatic group having alkyl group at one end | 3.64 | 3.31 |
| 734 | 0 | 3 | 2 | 7 | PA + aromatic group having alkyl group at both ends | 1.64 | 1.56 |
| 750 | 2 | 2 | 2 | 7 | PA + PN + aromatic group having alkyl group at both ends | 0.82 | 0.92 |
| 788 | 1 | 3 | 0 | 8 | PA + PN copolymer | 4.11 | 6.71 |
| 804 | 3 | 2 | 0 | 8 | PA + PN copolymer | 2.82 | 1.47 |
| 814 | 1 | 3 | 1 | 8 | PA + PN + aromatic group having alkyl group at one end | 4.35 | 4.41 |
| 830 | 3 | 2 | 1 | 8 | PA + PN + aromatic group having alkyl group at one end | 1.88 | 1.38 |
| 840 | 1 | 3 | 2 | 8 | PA + PN + aromatic group having alkyl group at both ends | 1.17 | 1.61 |
| 878 | 0 | 4 | 0 | 9 | Phenol aralkyl (PA) | 0.82 | 1.47 |
| 894 | 2 | 3 | 0 | 9 | PA + PN copolymer | 2.94 | 2.34 |
| 904 | 0 | 4 | 1 | 9 | PA + aromatic group having alkyl group at one end | 1.35 | 1.75 |
| 920 | 2 | 3 | 1 | 9 | PA + PN + aromatic group having alkyl group at one end | 2.70 | 2.21 |
| 984 | 1 | 4 | 0 | 10 | PA + PN copolymer | 1.47 | 1.42 |
| 1000 | 3 | 3 | 0 | 10 | PA + PN copolymer | 1.64 | 0.74 |
| 1010 | 1 | 4 | 1 | 10 | PA + PN + aromatic group having alkyl group at one end | 1.41 | 1.84 |
| 1026 | 3 | 3 | 1 | 10 | PA + PN + aromatic group having alkyl group at one end | 1.29 | 0.92 |
| 1090 | 2 | 4 | 0 | 11 | PA + PN copolymer | 1.06 | 0.78 |
| 1116 | 2 | 4 | 1 | 11 | PA + PN + aromatic group having alkyl group at one end | 1.06 | 1.19 |

TABLE 1-continued

GPC Analysis Results

| | % by mass of No. of each nucleus calculated by area method | | Calculated Mass Ratios of Respective Components from GPC Analysis Results and FD-MS Analysis Results | | | | | | | |
|---|---|---|---|---|---|---|---|---|---|---|
| | | | Phenol resin 1 (unit: % by mass) | | | | Phenol resin 2 (unit: % by mass) | | | |
| No. of nuclei | Phenol resin 1 | Phenol resin 2 | Component ratio | Formula (12) | Formula (13) | Formula (14) | Component ratio | Formula (15) | Formula (16) | Formula (17) |
| 2 | 10.4 | 12.1 | 10.4 | 10.4 | | | 12.1 | 12.1 | | |
| 3 | 19.1 | 20.2 | 12.4 | 12.4 | | | 12.9 | 12.9 | | |
| | | | 6.7 | | 6.7 | | 7.4 | | 7.4 | |
| 4 | 95 | 10.4 | 6.0 | 6.0 | | | 6.9 | 6.9 | | |
| | | | 1.2 | 1.2 | | | 0.8 | 0.8 | | |
| | | | 2.3 | | 2.3 | | 2.6 | | 2.6 | |
| 5 | 11.6 | 11.7 | 3.2 | 3.2 | | | 4.1 | 4.1 | | |
| | | | 4.3 | 4.3 | | | 2.7 | 2.7 | | |
| | | | 2.6 | | 2.6 | | 3.4 | | 3.4 | |
| | | | 1.0 | | 1.0 | | 1.1 | | 1.1 | |
| | | | 0.4 | | | 0.4 | 0.5 | | | 0.5 |
| 6 | 7.2 | 7.7 | 3.2 | 3.2 | | | 3.2 | 3.2 | | |
| | | | 1.3 | 1.3 | | | 1.0 | 1.0 | | |
| | | | 2.0 | | 2.0 | | 2.6 | | 2.6 | |
| | | | 0.4 | | 0.4 | | 0.3 | | 0.3 | |
| | | | 0.3 | | | 0.3 | 0.5 | | | 0.5 |
| 7 | 7.9 | 7.6 | 1.2 | 1.2 | | | 1.6 | 1.6 | | |
| | | | 2.8 | 2.8 | | | 1.8 | 1.8 | | |
| | | | 1.4 | | 1.4 | | 1.7 | | 1.7 | |
| | | | 1.5 | | 1.5 | | 1.4 | | 1.4 | |
| | | | 0.7 | | | 0.7 | 0.7 | | | 0.7 |
| | | | 0.3 | | | 0.3 | 0.4 | | | 0.4 |
| 8 | 5.2 | 5.3 | 1.5 | 1.5 | | | 2.3 | 2.3 | | |
| | | | 1.0 | 1.0 | | | 0.5 | 0.5 | | |
| | | | 1.6 | | 1.6 | | 1.5 | | 1.5 | |
| | | | 0.7 | | 0.7 | | 0.5 | | 0.5 | |
| | | | 0.4 | | | 0.4 | 0.6 | | | 0.6 |
| 9 or more* | 29.1 | 25.0 | 1.5 | 1.5 | | | 2.5 | 2.5 | | |
| | | | 5.4 | 5.4 | | | 4.0 | 4.0 | | |
| | | | 2.5 | | 2.5 | | 3.0 | | 3.0 | |
| | | | 5.0 | | 5.0 | | 3.8 | | 3.8 | |
| | | | 2.7 | 2.7 | | | 2.4 | 2.4 | | |
| | | | 3.0 | 3.0 | | | 1.3 | 1.3 | | |
| | | | 2.6 | | 2.6 | | 3.1 | | 3.1 | |
| | | | 2.4 | | 2.4 | | 1.6 | | 1.6 | |
| | | | 2.0 | 2.0 | | | 1.3 | 1.3 | | |
| | | | 2.0 | | 2.0 | | 2.0 | | 2.0 | |
| Total | | | 100.0 | 63.2 | 34.6 | 2.2 | 100.0 | 61.4 | 35.9 | 2.7 |

*Since it was difficult to analyze % by mass of the component of nona- or higher nuclear body according to GPC, % by mass of respective components of nona- or higher nuclear body was calculated.

Phenol resin 3: A phenol novolac resin (PR-HF-3, manufactured by Sumitomo Bakelite Co., Ltd., hydroxyl equivalent: 104, softening point: 80° C., ICI viscosity at 150° C.: 1.08 dPa·s).

Phenol resin 4: A phenol aralkyl resin (XLC-4L, manufactured by Mitsui Chemicals, Inc., hydroxyl equivalent: 168, softening point: 62° C., ICI viscosity at 150° C.: 0.76 dPa·s).

Phenol resin 5: For the synthesis of the phenol resin 1, an operation was carried in the same manner as in the phenol resin 1, except for using 29.4 parts by mass of p-xylylene glycol (p-xylylene glycol, manufactured by Tokyo Chemical Industry, Co., Ltd., melting point: 118° C., molecular weight: 138, purity: 98%), 11.5 parts by mass of a 37% aqueous formaldehyde solution (formalin 37%, manufactured by Wako Pure Chemical Industries, Ltd.), and 0 part by mass of 1,3,5-trimethylbenzene (a Cica special grade reagent, manufactured by Tokyo Chemical Industry, Co., Ltd., boiling point: 165° C., molecular weight: 120, purity: 99%), whereby a phenol resin 5 represented by the formula (18) (hydroxyl equivalent: 143, softening point: 77° C., ICI viscosity at 150° C.: 1.0 dPa·s) was obtained. In the same manner as in the phenol resin 1, GPC analysis and FD-MS analysis of the resulting phenol resin 5 were carried out and as a result, the mean values of a7 and b7 were a7=1.79 and b7=1.20.

[Chemical Formula 30]

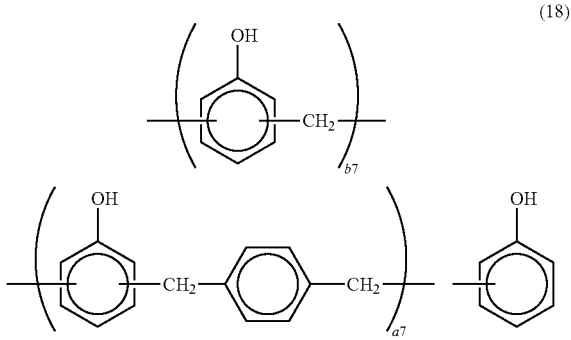

(18)

Phenol resin 6: 100 parts by mass of phenol (phenol, a special grade reagent, manufactured by Kanto Kagaku, melting point: 40.9° C., molecular weight: 94, purity: 99.3%), 67.7 parts by mass of a xylene formaldehyde resin (Nikanol LLL, manufactured by Fudow Co., Ltd., average molecular weight: 340), and 0.03 parts by mass of p-toluenesulfonic acid monohydrate (p-toluenesulfonic acid, manufactured by Wako Pure Chemical Industries, Ltd., molecular weight: 190, purity: 99%) were weighed in a separable flask. While the flask was purged with nitrogen, the resulting mixture was heated and began to be stirred in association with initiation of melting. After it was confirmed that the temperature in the system reached 110° C. and the reaction was carried out for 1 hour, and 48.8 parts by mass of a 37% aqueous formaldehyde solution (formalin 37%, manufactured by Wako Pure Chemical Industries, Ltd.) and 0.5 parts by mass of oxalic acid were added thereto over 30 minutes. Subsequently, the reaction was carried out for 120 minutes while maintaining the temperature in the system in the range of 100° C. to 110° C. During the period until completion of the reaction, moisture generated in the system by the reaction or entrained into the system along with the addition of formalin was discharged out of the system by nitrogen flow. After completion of the reaction, the unreacted component was removed under reduced-pressure condition of 160° C., and 2 mmHg. Subsequently, 200 parts by mass of toluene was added, and the mixture was homogeneously dissolved, and then transferred to a separating funnel. After 150 parts by mass of distilled water was added thereto and shaken, an operation (water washing) to remove a water layer was repeatedly carried out until cleaning water became neutralized, and then an oil layer was depressurized at 125° C. to remove volatile components such as toluene, remained unreacted component and the like, whereby a phenol resin 6 represented by the following formula (19) (hydroxyl equivalent: 167, softening point: 86° C., ICI viscosity at 150° C.: 2.1 dPa·s) was obtained. In the same manner as in the phenol resin 1, GPC analysis and FD-MS analysis of the resulting phenol resin 6 were carried out and as a result, the mean values of a8 and b9 were a8=1.51 and b8=1.40.

[Chemical Formula 31]

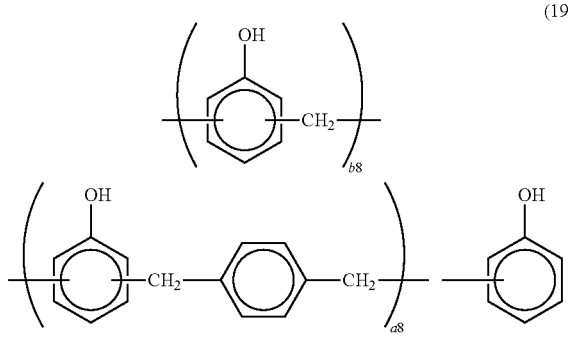

(19)

Figure 6:
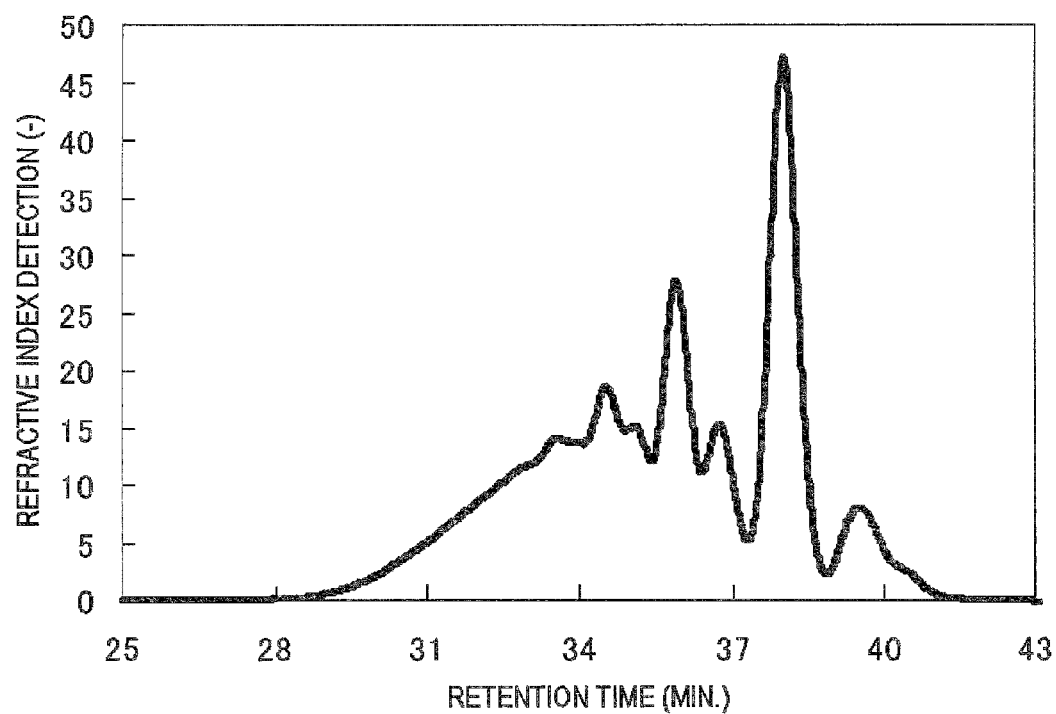
FIG. 6 is a GPC chart of a phenol resin 7 used in Example.
Figure 9:
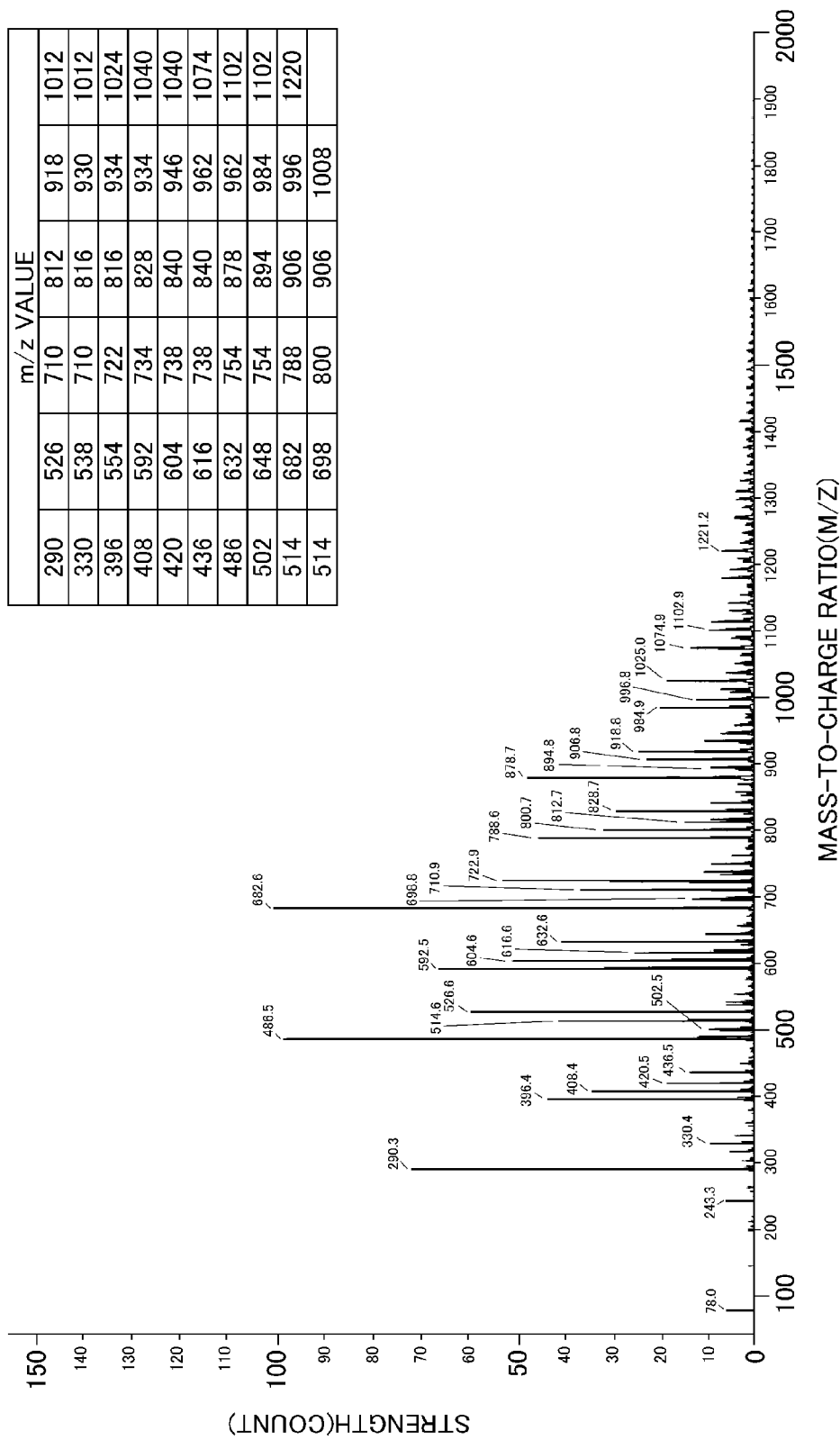
FIG. 9 is a FD-MS chart of a phenol resin 7 used in Example

Phenol resin 7: A separable flask was equipped with a stirring device, a thermometer, a reflux condenser and a nitrogen inlet. 100 parts by mass of m-xylene (m-xylene, a special grade reagent, manufactured by Kanto Kagaku, boiling point: 139° C., molecular weight: 106, purity: 99.4%) and 198 parts by mass of 20% by mass sodium hydroxide were weighed in the flask. Then, while the flask was purged with nitrogen, the resulting mixture began to be heated. The mixture was stirred for 30 minutes while maintaining the temperature in the system in the range of 50° C. to 60° C. and cooled to 10° C. Subsequently, 47.2 parts by mass of paraformaldehyde (paraformaldehyde, a special grade reagent, manufactured by Kanto Kagaku, molecular weight: 106, purity: 90%, pulverized one in the form of particles) was added thereto at once and reacted for 2 hours with stirring, and then 100 parts by mass of a 38% by mass aqueous hydrochloric acid solution was gradually added to neutralize the inside of the system, whereby an intermediate containing a methylolide was obtained. Incidentally, during the period of from initiation of the reaction to completion of the neutralization, the temperature was controlled such that the temperature in the system was in the range of 10° C. to 15° C. To this intermediate were further added 847 parts by mass of phenol (phenol, a special grade reagent, manufactured by Kanto Kagaku, melting point: 40.9° C., molecular weight: 94, purity: 99.3%) and 343 parts by mass of α,α"-dichloro-p-xylene (a reagent, manufactured by Tokyo Chemical Industry, Co., Ltd., melting point: 100° C., molecular weight: 175, purity: 98%). The resulting mixture was heated while purging the flask with nitrogen and stirring, and the reaction was carried out for 5 hours while maintaining the temperature in the system in the range of 110° C. to 120° C. Hydrochloric acid gas generated in the system by the above reaction was discharged out of the system by nitrogen flow. After completion of the reaction, the unreacted component and moisture were removed under reduced-pressure condition of 150° C., and 2 mmHg. Subsequently, 200 parts by mass of toluene was added, and the mixture was homogeneously dissolved, and then transferred to a separating funnel. After 150 parts by mass of distilled water was added thereto and shaken, an operation (water washing) to remove a water layer was repeatedly carried out until cleaning water became neutralized, and then an oil layer was depressurized at 125° C. to remove volatile components such as toluene, remained unreacted component and the like, whereby a phenol resin 7 represented by the following formula (44) (a mixture of polymers in which, in the formula (44), p is an integer of 0 to 20; q is an integer of 0 to 20; r is an integer of 0 to 20; and mean values of p, q and r are respectively 1.7, 0.3 and 0.6, hydroxyl equivalent: 175, softening point: 64° C., ICI viscosity at 150° C.: 0.47 dPa·s) was obtained. A GPC chart of the resulting phenol resin 7 is illustrated in FIG. 6, and a FD-MS chart is illustrated in FIG. 9. For example, m/z=514 of FD-MS analysis in FIG. 9 corresponds to a compound in which (p,q,r)=(1,1,0) in the formula (44), a left end is a hydrogen atom and a right end is a hydroxyphenyl group, and m/z=526 corresponds to a component in which (p,q,r)=(1,1,0) in the formula (44), a left end is a hydrogen atom and a right end is m-xylene, so that the phenol resin 7 was confirmed to contain the polymer (A1) having structural units represented by the general formula (31) and structural units represented by the general formula (32). Furthermore, m/z=604 corresponds to a component in which (p,q,r)=(2,0,1) in the formula (44), a left end is a hydrogen atom and a right end is m-xylene, and m/z=632 corresponds to a component in which (p,q,r)=(1,1,1) in the formula (44), a left end is a hydrogen atom and a right end is m-xylene, so that the phenol resin 7 was confirmed to contain the polymer (A0) having structural units represented by the general formula (1) and structural units represented by the general formula (2), and composed of one or more components having an aromatic group having at least one alkyl group with 1 to 3 carbon atoms at least at one end. Furthermore, in the measurement according to the area method of gel permeation chromatography, the amount of binuclear components was 6.8%, while in the measurement according to the relative intensity ratio of FD-MS, the total amount of polymers corresponding to the polymer (A1), the total amount of polymers corresponding to the component (A2) and the total amount of polymers corresponding to the component (A3) were respectively 28%, 66% and 6% in terms of the relative intensity ratio. Furthermore, the ratio of the total number of structural units represented by the general formula (31) to the total number of structural units represented by the general formula (32) was 85/15 in the total phenol resin 7.

Figure 7:
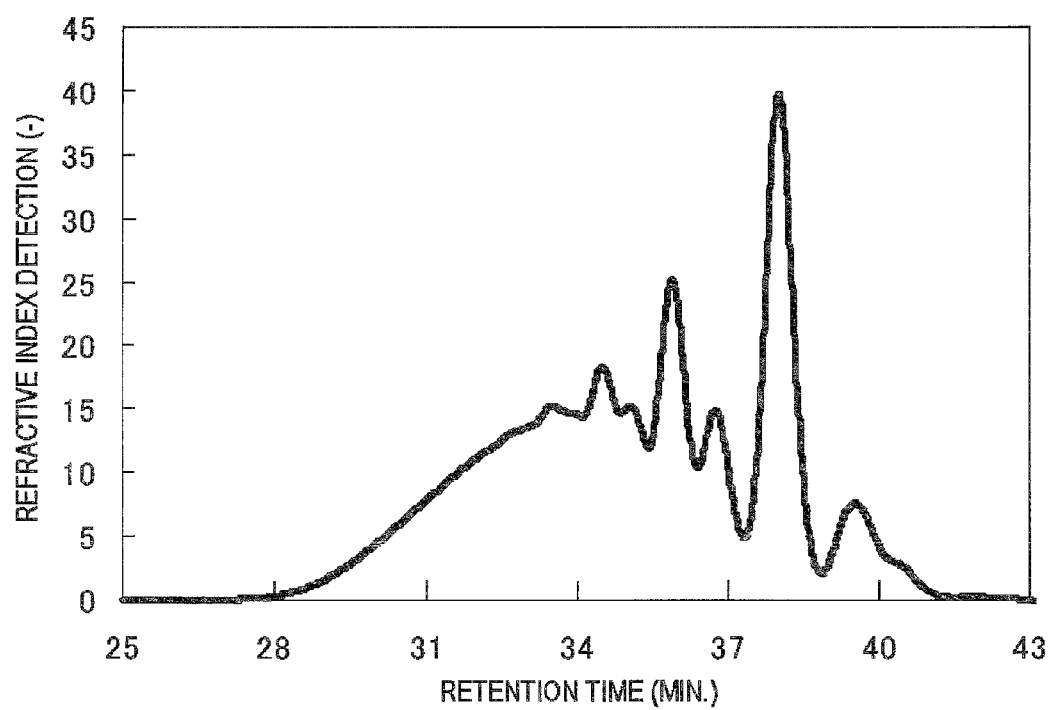
FIG. 7 is a GPC chart of a phenol resin 8 used in Example.
Figure 10:
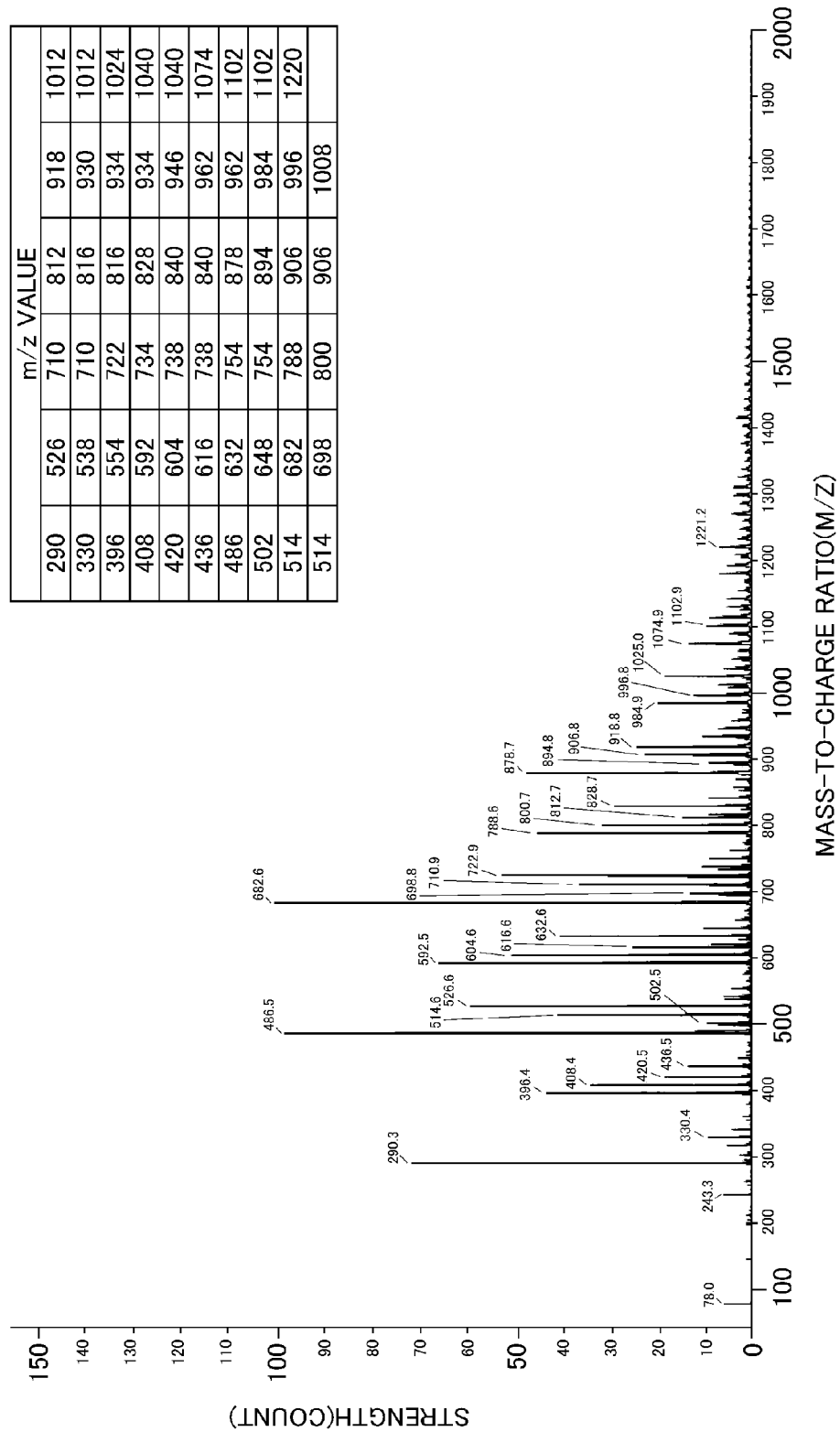
FIG. 10 is a FD-MS chart of a phenol resin 8 used in Example

Phenol resin 8: A separable flask was equipped with a stirring device, a thermometer, a reflux condenser and a nitrogen inlet. 116.3 parts by mass of a 37% aqueous formaldehyde solution (formalin 37%, manufactured by Wako Pure Chemical Industries, Ltd.), 37.7 parts by mass of 98% by mass sulfuric acid and 100 parts by mass of m-xylene (m-xylene, a special grade reagent, manufactured by Kanto Kagaku, boiling point: 139° C., molecular weight: 106, purity: 99.4%) were weighed in the flask. Then, while the flask was purged with nitrogen, the resulting mixture began to be heated. The mixture was stirred for 6 hours while maintaining the temperature in the system in the range of 90° C. to 100° C. and cooled to room temperature. Subsequently, 150 parts by mass of 20% by mass sodium hydroxide was gradually added to neutralize the inside of the system. To this reaction system were added 839 parts by mass of phenol and 338 parts by mass of α,α'-dichloro-p-xylene. The resulting mixture was heated while purging the flask with nitrogen and stirring, and the reaction was carried out for 5 hours while maintaining the temperature in the system in the range of 110° C. to 120° C. Hydrochloric acid gas generated in the system by the above reaction was discharged out of the system by nitrogen flow. After completion of the reaction, the unreacted component and moisture were removed under reduced-pressure condition of 150° C. 2 mmHg. Subsequently, 200 parts by mass of toluene was added, and the mixture was homogeneously dissolved, and then transferred to a separating funnel. After 150 parts by mass of distilled water was added thereto and shaken, an operation (water washing) to remove a water layer was repeatedly carried out until cleaning water became neutralized, and then an oil layer was depressurized at 125° C. to remove volatile components such as toluene, remained unreacted component and the like, whereby a phenol resin 8 represented by the following formula (44) (a mixture of polymers in which, in the formula (44), p was an integer of 0 to 20; q was an integer of 0 to 20; r was an integer of 0 to 20; and mean values of p, q and r were respectively 1.8, 0.3, 0.6, hydroxyl equivalent: 180, softening point: 67° C., ICI viscosity at 150° C.: 0.60 dPa·s) was obtained. A GPC chart of the resulting phenol resin 8 is illustrated in FIG. 7, while a FD-MS chart is illustrated in FIG. 10. For example, m/z=514 of FD-MS analysis in FIG. 10 corresponds to a component in which (p,q,r)=(1,1,0) in the formula (14), a left end is a hydrogen atom and a right end is a hydroxyphenyl group, and m/z=526 corresponds to a component in which (p,q,r)=(1,1,0) in the formula (44), a left end is a hydrogen atom and a right end is m-xylene, so that the phenol resin 8 was confirmed to contain the polymer (A1) having structural units represented by the general formula (31) and structural units represented by the general formula (32). Furthermore, m/z=604 corresponds to a component in which (p,q,r)=(2,0,1) in the formula (44), a left end is a hydrogen atom and a right end is m-xylene, and m/z=632 corresponds to a component in which (p,q,r)=(1,1,1) in the formula (44), a left end is a hydrogen atom and a right end is m-xylene, so that the phenol resin 8 was confirmed to contain the polymer (A0) having structural units represented by the general formula (1) and structural units represented by the general formula (2), and composed of one or more components having an aromatic group having at least one alkyl group with 1 to 3 carbon atoms at least at one end. Furthermore, in the measurement according to the area method of gel permeation chromatography, the amount of binuclear components was 6.6%, while in the measurement according to the relative intensity ratio of FD-MS, the total amount of polymers corresponding to the polymer (A1), the total amount of polymers corresponding to the component (A2) and the total amount of polymers corresponding to the component (A3) were respectively 30%, 64% and 6% in terms of the relative intensity ratio. Furthermore, the ratio of the total number of structural units represented by the general formula (31) to the total number of structural units represented by the general formula (32) was 85/15 in the total phenol resin 8.

[Chemical Formula 32]

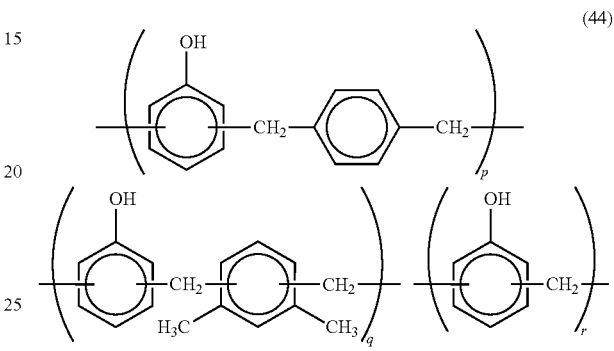

(44)

Figure 8:
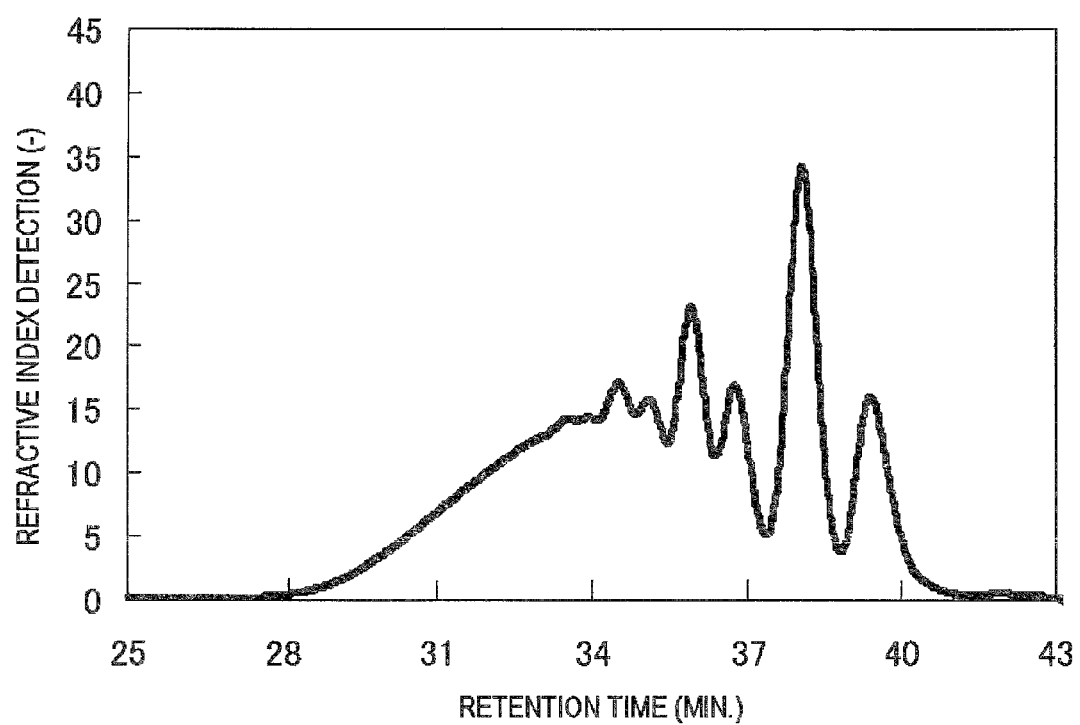
FIG. 8 is a GPC chart of a phenol resin 9 used in Example.
Figure 11:
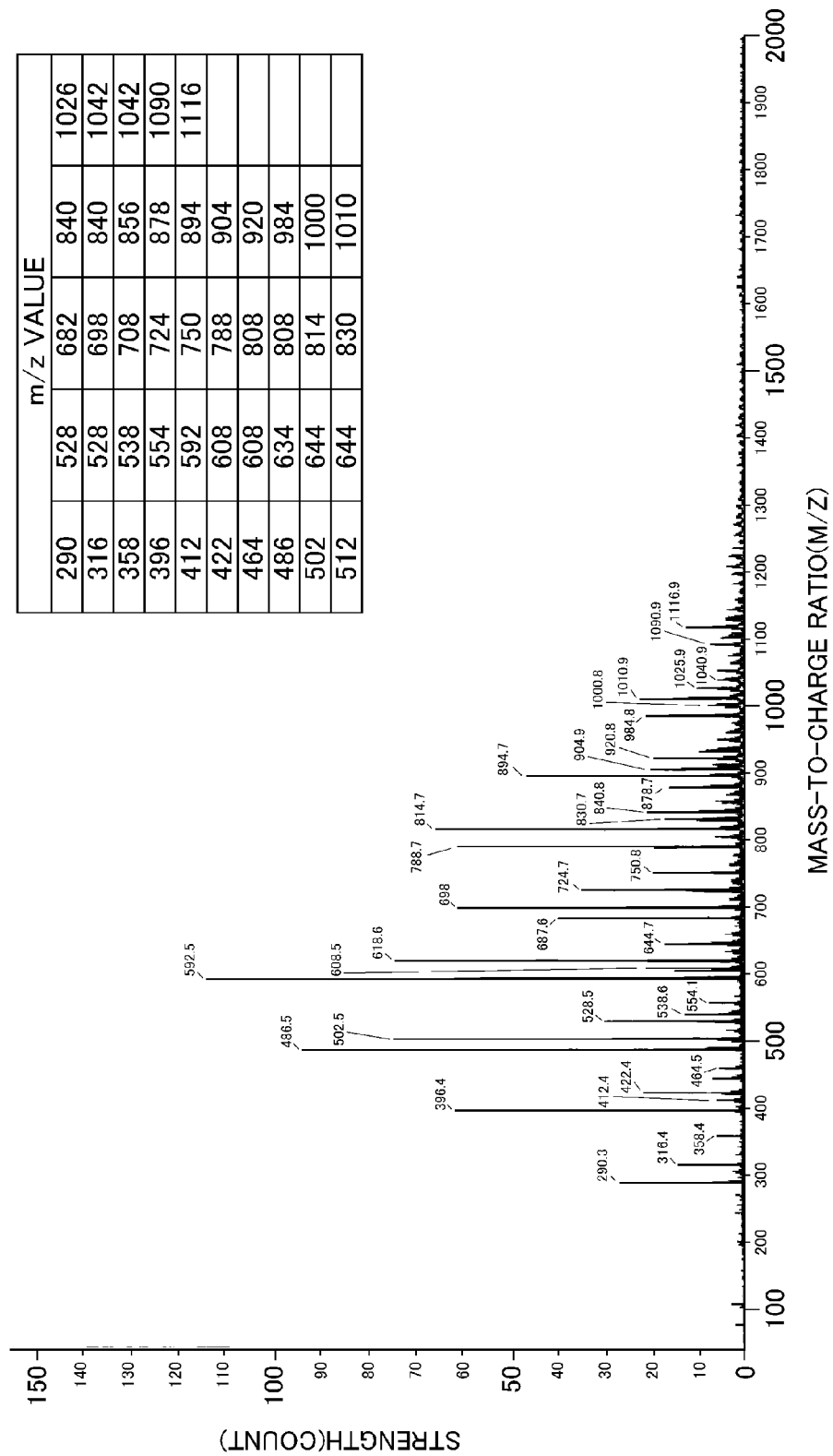
FIG. 11 is a FD-MS chart of a phenol resin 9 used in Example

Phenol resin 9: For the synthesis of the phenol resin 7, a synthesis operation was carried out in the same manner as in the phenol resin 7, except that 100 parts by mass of 1,3,5-trimethylbenzene (a Cica special grade reagent, manufactured by Tokyo Chemical Industry, Co., Ltd., boiling point: 165° C., molecular weight: 120, purity: 99%) was used in place of m-xylene, the mixing amount of 20% by mass sodium hydroxide was changed to 175 parts by mass, the mixing amount of paraformaldehyde was changed to 66.7 parts by mass, the mixing amount of phenol was changed to 1,372 parts by mass, and the mixing amount of α,α'-dichloro-p-xylene was changed to 620 parts by mass, whereby a phenol resin 9 represented by the following formula (46) (a mixture of polymers in which, in the formula (46), u is an integer of 0 to 20; v is an integer of 0 to 20; w is an integer of 0 to 20; mean values of u, v, w are respectively 1.9, 0.1 and 0.9, hydroxyl equivalent: 164, softening point: 68° C., ICI viscosity at 150° C.: 0.65 dPa·s) was obtained. A GPC chart of the resulting phenol resin 9 is illustrated in FIG. 8, while a FD-MS chart is illustrated in FIG. 11. For example, m/z=528 of FD-MS analysis in FIG. 11 corresponds to a component in which (u,v,w)=(1,1,0) in the formula (44), a left end is a hydrogen atom and a right end is a hydroxyphenyl group, so that the phenol resin 9 was confirmed to contain the polymer (A1) having structural units represented by the general formula (31) and structural units represented by the general formula (32). Furthermore, m/z=422 corresponds to a component in which (p,q,r)=(1,0,1) in the formula (44), a left end is a hydrogen atom and a right end is 1,3,5-trimethylbenzene, and m/z=618 corresponds to a component in which (p,q,r)=(2,0,1) in the formula (44), a left end is a hydrogen atom and a right end is 1,3,5-trimethylbenzene, so that the phenol resin 9 was confirmed to contain the polymer (A0) having structural units represented by the general formula (1) and structural units represented by the general formula (2), and composed of one or more components having an aromatic group having at least one alkyl group with 1 to 3 carbon atoms at least at one end. Furthermore, in the measurement according to the area method of gel permeation chromatography, the amount of binuclear components was 11%, while in the measurement according to the relative intensity ratio of FD-MS, the total amount of polymers corresponding to the polymer (A1), the total amount of polymers corresponding to the component (A2), the total amount of polymers corresponding to the component (A3) and the total amount of components not corresponding to (A1) to (A3) (u=v=o) were respectively 12%, 86%, 1% and 1% in terms of the relative intensity ratio. Furthermore, the ratio of the total number of structural units represented by the general formula (31) to the total number of structural units represented by the general formula (32) was 94/6 in the total phenol resin 9.

[Chemical Formula 33]

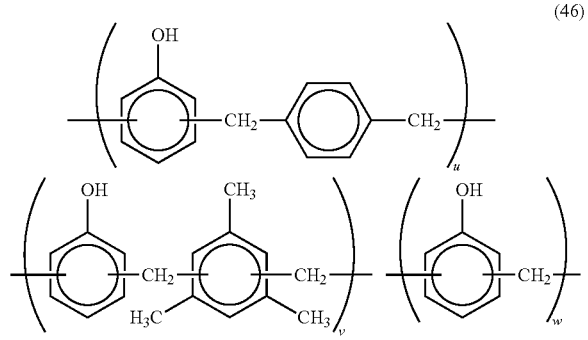

(46)

Phenol resin 10: A phenol resin represented by the following formula (48) (Xistar GP-90, manufactured by Fudow Co., Ltd., hydroxyl equivalent: 197, softening point: 86° C., ICI viscosity at 150° C.: 3.1 dPa·s),

[Chemical Formula 34]

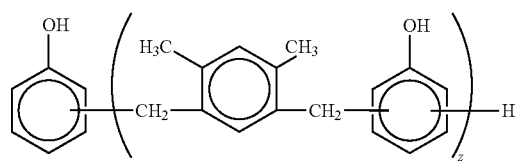

(48)

For the obtained phenol resins 1 to 10, the softening points and the ICI viscosities are shown in Table 2. Furthermore, these phenol resins were evaluated in terms of blocking. The results are shown in Table 2 below.

Incidentally, evaluation of blocking for the phenol resins 1 to 10 was conducted in the following manner.

To a polypropylene cylindrical container having an internal pressure of 29 mm and a height of 10 cm was put 20 g of a granular phenol resin cooled to 5° C. in advance. A piston having an external size of 29 mm and a mass of 200 g was inserted into the cylindrical container, and a load was applied to the phenol resin by the piston which was positioned vertically upright in a constant temperature bath set to a predetermined temperature for a predetermined period of time. Thereafter, the cylindrical container was put upside down to take out a phenol resin therefrom. At that time, when the phenol resin was easily taken out from the container in the original granular form, it was indicated as AA. When it was easily released by hand while having the inside shape of the piston, it was indicated as BB. When it was not released by hand as it had the inside shape of the piston, it was indicated as CC. When the resin was melted and was not taken out from the container, it was indicated as DD. The results showed that phenol resins 1, 2, A, and B exhibited excellent blocking properties while having low viscosity, as compared to XLC-3L manufactured by Mitsui Chemicals, Inc.

TABLE 2

| | Phenol Resin | | | | |
|---|---|---|---|---|---|
| | 1 | 2 | 3 | 4 | 5 |
| Softening Point [° C.] | 67 | 68 | 80 | 62 | 77 |
| ICI Viscosity (150° C.) [dPa·s] | 0.65 | 0.75 | 1.08 | 0.76 | 1.00 |
| Evaluation of blocking properties | 10 hr at 12° C. | AA | AA | AA | AA | AA |
| | 10 hr at 15° C. | AA | AA | BB | BB | AA |
| | 10 hr at 18° C. | BB | BB | BB | DD | BB |

| | Phenol Resin | | | | |
|---|---|---|---|---|---|
| | 6 | 7 | 8 | 9 | 10 |
| Softening Point [° C.] | 86 | 64 | 67 | 68 | 86 |
| ICI Viscosity (150° C.) [dPa·s] | 2.1 | 0.5 | 0.6 | 0.7 | 3.1 |
| Evaluation of blocking properties | 10 hr at 12° C. | AA | AA | AA | AA | AA |
| | 10 hr at 15° C. | AA | AA | AA | AA | AA |
| | 10 hr at 18° C. | BB | BB | BB | BB | BB |

Epoxy Resin

The following epoxy resins 1 to 9 were used.

Epoxy resin 1: An ortho-cresol novolac type epoxy resin (N660, manufactured by DIC Corporation, epoxy equivalent: 210, softening point: 62° C.)

Epoxy resin 2: A phenol aralkyl type epoxy resin (E-XLC-3L, manufactured by Mitsui Chemicals, Inc., epoxy equivalent: 238, softening point: 52° C.).

Epoxy resin 3: A biphenyl aralkyl type epoxy resin (NC3000, manufactured by Nippon Kayaku Co., Ltd., epoxy equivalent: 276, softening point: 58° C.)

Epoxy resin 4: A dicyclopentadiene type epoxy resin (HP7200L, manufactured by DIC Corporation, epoxy equivalent: 244, softening point: 56° C.)

Epoxy resin 5: A methoxynaphthalene type epoxy resin (EXA7320, manufactured by DIC Corporation, epoxy equivalent: 251, softening point: 58° C.)

Epoxy resin 6: A biphenyl type epoxy resin (YX4000K, manufactured by Japan Epoxy Resin Co., Ltd., epoxy equivalent: 185, softening point: 107° C.)

Epoxy resin 7: A bisphenol F type epoxy resin (YSLV-80XY, manufactured by Nippon Steel Chemical Co., Ltd., epoxy equivalent: 190, softening point: 80° C.).

Epoxy resin 8: A bisphenol S type epoxy resin represented by the following formula (49) (YSLV-120TE, manufactured by Nippon Steel Chemical Co., Ltd., epoxy equivalent: 240, softening point: 120° C.),

[Chemical Formula 35]

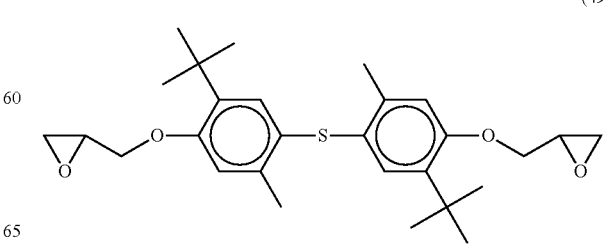

(49)

Epoxy resin 9: A bisphenol A type epoxy resin (YL6810, manufactured by Japan Epoxy Resin Co., Ltd., epoxy equivalent: 172, softening point: 45°).

Inorganic Filler

As an inorganic filler, there was used a blend of 100 parts by mass of molten spherical silica FB560 manufactured by Denki Kagaku Kogyo Kabushiki Kaisha (average particle diameter: 30 μm), 6.5 parts by mass of synthetic spherical silica S0-C2 manufactured by Admatechs (average particle diameter: 0.5 μm), and 7.5 parts by mass of synthetic spherical silica SO-C5 manufactured by Admatechs (average particle diameter: 30 μm).

Curing Accelerator

The following curing accelerators 1 to 5 were used.

Curing accelerator 1: A curing accelerator represented by the following formula (20),

[Chemical Formula 36]

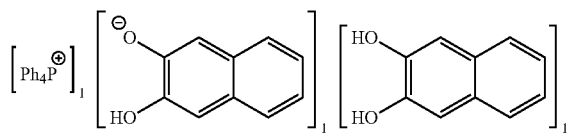
(20)

Curing accelerator 2: A curing accelerator represented by the following formula (21),

[Chemical Formula 37]

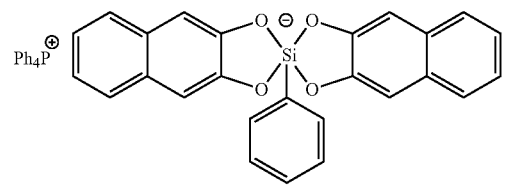
(21)

Curing accelerator 3: A curing accelerator represented by the following formula (22),

[Chemical Formula 38]

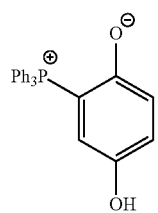
(22)

Curing accelerator 4: A curing accelerator represented by the following formula (23),

[Chemical Formula 39]

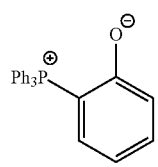
(23)

Curing accelerator 5: Triphenylphosphine (TPP, manufactured by Hokko Chemical Industry Co., Ltd.).

Compound E

As a compound E, a compound represented by the following formula (24) (2,3-naphthalenediol, manufactured by Tokyo Chemical Industry, Co., Ltd., purity: 98%) was used,

[Chemical Formula 40]

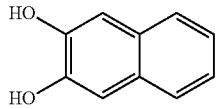
(24)

Silane Coupling Agent

The following silane coupling agents 1 to 3 were used.

Silane Coupling Agent 1:
γ-mercaptopropyltrimethoxysilane (KBM-803, manufactured by Shin-Etsu Chemical Co., Ltd.).

Silane Coupling Agent 2:
γ-glycidoxypropyltrimethoxysilane (KBM-403, manufactured by Shin-Etsu Chemical Co., Ltd.).

Silane Coupling Agent 3:
N-phenyl-3-aminopropyltrimethoxysilane (KBM-573, manufactured by Shin-Etsu Chemical Co, Ltd.).

Coloring Agent

As a coloring agent, carbon black (MA600) manufactured by Mitsubishi Chemical Corporation was used.

Releasing Agent

As a releasing agent, a carnauba wax (Nikko Carnauba, manufactured by Fine Products Co., Ltd., melting point: 83° C.) was used.

Flame Retardant

The following flame retardants 1 and 2 were used.

Flame retardant 1: Aluminum hydroxide (CL310, manufactured by Sumitomo Chemical Co., Ltd.).

Flame retardant 2: A complex metal hydroxide (magnesium hydroxide and zinc hydroxide solid solution, Echomag Z-10, manufactured by Tateho Chemical Industries Co., Ltd.).

Evaluation Method of the Resin Composition for Encapsulating a Semiconductor

Spiral flow: The epoxy resin composition was injected into a mold for a spiral flow measurement in accordance with EMMI-1-66 under the conditions of a temperature of 175° C., an injection pressure of 6.9 MPa, and a pressure application time of 120 seconds using a low-pressure transfer molding machine (KTS-15, manufactured by Kohtaki Precision Machine Co., Ltd.) to measure the flow length. The spiral flow is a parameter of flowability, and a larger value of the spiral flow means better flowability. The spiral flow is given in units of centimeters (cm).

Flame resistance: The epoxy resin composition was injection-molded under the conditions of a mold temperature of 175° C., an injection pressure of 9.8 MPa, an injection time of 15 seconds, and a curing time of 120 seconds using a low-pressure transfer molding machine (KTS-30, manufactured by Kohtaki Precision Machine Co., Ltd.) to prepare a flame-resistant test piece having a thickness of 3.2 mm. The prepared test piece was subjected to a flame resistance test in accordance with a standard specified in the UL-94 vertical method to evaluate flame resistance. Fmax, ΣF and rank of flame resistance after determination were shown in Tables.

Wire sweeping ratio: The tableted resin composition was injected under the conditions of a temperature of 175° C., a pressure of 6.9 MPa, and a time period of 120 seconds using a low-pressure transfer molding machine to mold respective 10 of 208-pin QFP packages for the evaluation test of the amount of wire sweeping (size; 28×28×2.4 mm, a copper (Cu) lead frame, test element: 9×9 mm, wire; Au, diameter: 1.2 mils, length: about 5 mm). The molded 208-pin QFP packages were observed with a soft X-ray fluoroscope. As a method of calculating the wire sweeping ratio, the amount of sweeping of the wire that was swept the most (transformed) in one package was (F), and the length of the wire was (L) to calculate the sweeping ratio of F/L×100(%), indicating the mean value of 10 packages. Incidentally, when the wire sweeping ratio was less than 5%, it was acceptable. When it was not less than 5%, it was not acceptable.

Continuous molding property: The obtained resin composition was controlled to have the weight of 15 g and a size of φ18 mm×about 30 mm (height) using a powder molding press (S-20-A, manufactured by Tamagawa Machinery Co., Ltd.) and tableted under a tablet pressure of 600 Pa to obtain a tablet. A tablet supply magazine with the obtained tablet placed therein was set to the inside of the molding machine. Using a low-pressure automatic transfer molding machine (GP-ELF, manufactured by Dai-ichi Seiko Co., Ltd.) as a molding machine for molding purpose, 400 shots of molding of 80-pin QFP (a copper (Cu) lead frame, package outer size: 14 mm×20 mm×2.0 mm (thickness), pad size: 8.0 mm×8.0 mm, chip size: 7.0 mm×7.0 mm×0.35 mm (thickness)) obtained by encapsulating a silicon chip or the like with a resin composition under the conditions of a mold temperature of 175° C., a molding pressure of 9.8 MPa and a curing time of 120 seconds were conducted in a continuous manner. At this time, under the item of "defective filling" in Tables, the number of shots where the molding state (presence or absence of insufficient filing) of the package per every 50 shots was confirmed and the insufficient filling was first confirmed was indicated, or o marks were indicated when insufficient filling was not detected. In addition, the tablet in the magazine set inside the molding machine was in a standby state in the magazine of the molding machine during the period until substantial use for molding, and at a surface temperature of about 30° C., was in a state in which maximum 13 packages were vertically stacked. For supplying and transferring of the tablet in the molding machine, the uppermost tablet was pushed out from the upper part of the magazine by raising the push-up pin from the bottommost part of the magazine, lifted with a mechanical arm, and transferred to the pot for transfer molding. At this time, when the tablet waiting in the magazine was adhered on the upper or lower side, defective transfer took place. Under the item of "defective transfer" in Tables, the number of shots where defective transfer was first confirmed was indicated, or o marks were indicated when defective transfer did not take place.

Solder resistance test 1: The epoxy resin composition was injected under the conditions of a mold temperature of 180° C., an injection pressure of 7.4 MPa, and a curing time of 120 seconds using a low-pressure transfer molding machine (GP-ELF, manufactured by Dai-rhi Seiko Co., Ltd.) to perform encapsulation molding of a lead frame on which a semiconductor element (silicon chip) was mounted. Thus, a semiconductor device composed of 80p-QFPs (a copper (Cu) lead frame, size: 14 mm×20 mm×2.00 mm (thickness), semiconductor element size: 7 mm×7 mm×0.35 mm (thickness), the semiconductor element being bonded to inner lead part of a lead frame using a gold wire having a diameter of 25 μm) was prepared. The prepared six semiconductor devices were post-cured by being heat-treated at 175° C. for four hours. A humidification process was performed on the six semiconductor devices at 60° C. and a relative humidity of 60% for 120 hours, and an IR reflow process (at 260° C. in accordance with the condition of JEDEC Level 3) was then performed. The presence or absence of detachment and cracks inside the semiconductor devices after the processes was observed with a scanning acoustic tomograph (mi-scope 10, manufactured by Hitachi Kenki Fine Tech Co., Ltd.). Semiconductor devices in which at least one of detachment or a crack was generated were evaluated as defective. When the number of defective semiconductor devices was n, the result was shown as n/6.

Solder resistance test 2: A test was performed in the same manner as in the solder resistance test 1, except that the humidification process conditions of the above solder resistance test 1 were changed to a temperature of 85° C. and a relative humidity of 60 for 168 hours.

Solder resistance test 3: A test was performed in the same manner as in the solder resistance test 1, except that the humidification process conditions of the above solder resistance test 1 were changed to a temperature of 85° C. and a relative humidity of 85% for 72 hours.

Example 1

The following components were mixed using a mixer at normal temperature, and melt-kneaded through a hot roller at 80° C. to 100° C. After being cooled, the mixture was pulverized to obtain a resin composition for encapsulating a semiconductor. The resulting resin composition for encapsulating a semiconductor was evaluated. The evaluation results are shown in Tables 3 and 4.

| Phenol resin 1 | 5.45 parts by mass |
| Epoxy resin 1 | 7.55 parts by mass |
| Inorganic filler | 86 parts by mass |
| Curing accelerator 1 | 0.4 parts by mass |
| Silane coupling agent 1 | 0.1 part by mass |
| Silane coupling agent 2 | 0.1 part by mass |
| Coloring agent | 0.3 parts by mass |
| Releasing agent | 0.1 part by mass |

Examples 2 to 14 and Comparative Examples 1 to 4

Epoxy resin compositions were produced in the same manner as in Example 1 according to formulations shown in Tables 3 and 4, and evaluated in the same manner as in Example 1. The evaluation results are shown in Tables 3 and 4.

TABLE 3

|  | Example 1 | Example 2 | Example 3 | Example 4 | Example 5 |
| --- | --- | --- | --- | --- | --- |
| Epoxy Resin 1 | 7.55 | 7.42 |  |  |  |
| Epoxy Resin 2 |  |  | 7.94 |  |  |
| Epoxy Resin 3 |  |  |  | 5.85 |  |
| Epoxy Resin 4 |  |  |  |  | 5.59 |
| Epoxy Resin 5 |  |  |  |  |  |
| Epoxy Resin 6 |  |  |  | 2.14 | 2.14 |

TABLE 3-continued

|  |  |  |  |  |  |
|---|---|---|---|---|---|
| Epoxy Resin 7 |  |  |  |  |  |
| Phenol Resin 1 | 5.45 |  | 5.06 | 4.96 | 5.22 |
| Phenol Resin 2 |  | 5.58 |  |  |  |
| Phenol Resin 3 |  |  |  |  |  |
| Phenol Resin 4 |  |  |  |  |  |
| Phenol Resin 5 |  |  |  |  |  |
| Phenol Resin 6 |  |  |  |  |  |
| Inorganic Filler 1 | 86.00 | 86.00 | 86.00 | 86.00 | 86.00 |
| Curing Accelerator 1 | 0.40 | 0.40 | 0.40 | 0.45 | 0.45 |
| Curing Accelerator 2 |  |  |  |  |  |
| Curing Accelerator 3 |  |  |  |  |  |
| Curing Accelerator 4 |  |  |  |  |  |
| Curing Accelerator 5 |  |  |  |  |  |
| Compound (E) |  |  |  |  |  |
| Silane Coupling Agent 1 | 0.10 | 0.10 | 0.10 | 0.10 | 0.10 |
| Silane Coupling Agent 2 | 0.10 | 0.10 | 0.10 | 0.10 | 0.10 |
| Coloring Agent | 0.30 | 0.30 | 0.30 | 0.30 | 0.30 |
| Releasing Agent | 0.10 | 0.10 | 0.10 | 0.10 | 0.10 |
| Spiral Flow (cm) | 102 | 97 | 102 | 112 | 105 |
| Frame Resistance Test $\Sigma F$ (sec) | 49 | 48 | 31 | 11 | 23 |
| Frame Resistance Test Fmax (sec) | 9 | 9 | 9 | 4 | 7 |
| Frame Resistance Test Rank | V-0 | V-0 | V-0 | V-0 | V-0 |
| Solder Resistance Test 1 (Number of defective ones in n = 6) | 0/6 | 0/6 | 0/6 | 0/6 | 0/6 |
| Solder Resistance Test 2 (Number of defective ones in n = 6) | 0/6 | 0/6 | 0/6 | 0/6 | 0/6 |

|  | Example 6 | Example 7 | Example 8 | Example 9 |
|---|---|---|---|---|
| Epoxy Resin 1 |  |  |  |  |
| Epoxy Resin 2 |  |  |  |  |
| Epoxy Resin 3 |  | 5.85 |  |  |
| Epoxy Resin 4 |  |  | 5.59 |  |
| Epoxy Resin 5 | 5.65 |  |  | 5.65 |
| Epoxy Resin 6 | 2.14 |  |  |  |
| Epoxy Resin 7 |  | 2.16 | 2.16 | 2.16 |
| Phenol Resin 1 | 5.16 | 4.93 | 5.19 | 5.13 |
| Phenol Resin 2 |  |  |  |  |
| Phenol Resin 3 |  |  |  |  |
| Phenol Resin 4 |  |  |  |  |
| Phenol Resin 5 |  |  |  |  |
| Phenol Resin 6 |  |  |  |  |
| Inorganic Filler 1 | 86.0 | 86.0 | 86.0 | 86.0 |
| Curing Accelerator 1 | 0.45 | 0.45 | 0.45 | 0.45 |
| Curing Accelerator 2 |  |  |  |  |
| Curing Accelerator 3 |  |  |  |  |
| Curing Accelerator 4 |  |  |  |  |
| Curing Accelerator 5 |  |  |  |  |
| Compound (E) |  |  |  |  |
| Silane Coupling Agent 1 | 0.10 | 0.10 | 0.10 | 0.10 |
| Silane Coupling Agent 2 | 0.10 | 0.10 | 0.10 | 0.10 |
| Coloring Agent | 0.30 | 0.30 | 0.30 | 0.30 |
| Releasing Agent | 0.10 | 0.10 | 0.10 | 0.10 |
| Spiral Flow (cm) | 113 | 115 | 109 | 115 |
| Frame Resistance Test $\Sigma F$ (sec) | 37 | 9 | 28 | 43 |
| Frame Resistance Test Fmax (sec) | 8 | 2 | 8 | 10 |
| Frame Resistance Test Rank | V-0 | V-0 | V-0 | V-0 |
| Solder Resistance Test 1 (Number of defective ones in n = 6) | 0/6 | 0/6 | 0/6 | 0/6 |
| Solder Resistance Test 2 (Number of defective ones in n = 6) | 0/6 | 0/6 | 0/6 | 0/6 |

TABLE 4

|  | Example 10 | Example 11 | Example 12 | Example 13 | Example 14 |
|---|---|---|---|---|---|
| Epoxy Resin 1 |  |  |  |  |  |
| Epoxy Resin 2 |  |  |  |  |  |
| Epoxy Resin 3 | 5.84 | 5.92 | 5.92 | 5.92 | 6.27 |
| Epoxy Resin 4 |  |  |  |  |  |
| Epoxy Resin 5 |  |  |  |  |  |
| Epoxy Resin 6 | 2.12 | 2.22 | 2.22 | 2.22 | 2.29 |
| Epoxy Resin 7 |  |  |  |  |  |
| Phenol Resin 1 | 4.94 | 5.01 | 5.01 | 5.01 | 2.63 |
| Phenol Resin 2 |  |  |  |  |  |
| Phenol Resin 3 |  |  |  |  | 1.76 |
| Phenol Resin 4 |  |  |  |  |  |
| Phenol Resin 5 |  |  |  |  |  |
| Phenol Resin 6 |  |  |  |  |  |
| Inorganic Filler 1 | 86 | 86 | 86 | 86 | 86 |
| Curing Accelerator 1 |  |  |  |  | 0.45 |
| Curing Accelerator 2 | 0.5 |  |  |  |  |
| Curing Accelerator 3 |  | 0.25 |  |  |  |
| Curing Accelerator 4 |  |  | 0.25 |  |  |
| Curing Accelerator 5 |  |  |  | 0.2 |  |
| Compound (E) |  |  |  | 0.05 |  |
| Silane Coupling Agent 1 | 0.1 | 0.1 | 0.1 | 0.1 | 0.1 |
| Silane Coupling Agent 2 | 0.1 | 0.1 | 0.1 | 0.1 | 0.1 |
| Coloring Agent | 0.3 | 0.3 | 0.3 | 0.3 | 0.3 |
| Releasing Agent | 0.1 | 0.1 | 0.1 | 0.1 | 0.1 |
| Spiral Flow (cm) | 118 | 115 | 114 | 100 | 98 |
| Frame Resistance Test ΣF (sec) | 9 | 15 | 17 | 19 | 21 |
| Frame Resistance Test Fmax (sec) | 2 | 4 | 3 | 4 | 5 |
| Frame Resistance Test Rank | V-0 | V-0 | V-0 | V-0 | V-0 |
| Solder Resistance Test 1 (Number of defective ones in n = 6) | 0/6 | 0/6 | 0/6 | 0/6 | 0/6 |
| Solder Resistance Test 2 (Number of defective ones in n = 6) | 0/6 | 0/6 | 0/6 | 0/6 | 0/6 |

|  | Comp. Example 1 | Comp. Example 2 | Comp. Example 3 | Comp. Example 4 |
|---|---|---|---|---|
| Epoxy Resin 1 | 8.83 | 7.38 | 8.06 | 7.40 |
| Epoxy Resin 2 |  |  |  |  |
| Epoxy Resin 3 |  |  |  |  |
| Epoxy Resin 4 |  |  |  |  |
| Epoxy Resin 5 |  |  |  |  |
| Epoxy Resin 6 |  |  |  |  |
| Epoxy Resin 7 |  |  |  |  |
| Phenol Resin 1 |  |  |  |  |
| Phenol Resin 2 |  |  |  |  |
| Phenol Resin 3 | 4.17 |  |  |  |
| Phenol Resin 4 |  | 5.62 |  |  |
| Phenol Resin 5 |  |  | 4.94 |  |
| Phenol Resin 6 |  |  |  | 6.23 |
| Inorganic Filler 1 | 86 | 86 | 86 | 86 |
| Curing Accelerator 1 | 0.4 | 0.4 | 0.4 | 0.4 |
| Curing Accelerator 2 |  |  |  |  |
| Curing Accelerator 3 |  |  |  |  |
| Curing Accelerator 4 |  |  |  |  |
| Curing Accelerator 5 |  |  |  |  |
| Compound (E) |  |  |  |  |
| Silane Coupling Agent 1 | 0.1 | 0.1 | 0.1 | 0.1 |
| Silane Coupling Agent 2 | 0.1 | 0.1 | 0.1 | 0.1 |
| Coloring Agent | 0.3 | 0.3 | 0.3 | 0.3 |
| Releasing Agent | 0.1 | 0.1 | 0.1 | 0.1 |
| Spiral Flow (cm) | 84 | 82 | 84 | 68 |
| Frame Resistance Test ΣF (sec) | * | 92 | 72 | * |
| Frame Resistance Test Fmax (sec) | * | 18 | 14 | * |
| Frame Resistance Test Rank | Burnout | V-1 | V-1 | Burnout |

TABLE 4-continued

| | | | | |
|---|---|---|---|---|
| Solder Resistance Test 1 (Number of defective ones in n = 6) | 3/6 | 0/6 | 2/8 | 0/6 |
| Solder Resistance Test 2 (Number of defective ones in n = 6) | 6/6 | 2/6 | 4/6 | 3/6 |

* "Burnout" was determined when it took 30 seconds or more for burning.

Examples 15 to 34 and Comparative Examples 5 to 9

Epoxy resin compositions were produced in the same manner as in Example 1 according to formulations shown in Tables 5 to 8, and evaluated in the same manner as in Example 1. The evaluation results are shown in Tables 5 to 8.

TABLE 5

| | Example | | | | |
|---|---|---|---|---|---|
| | 15 | 16 | 17 | 18 | 19 |
| Phenol Resin 3 | | | | | |
| Phenol Resin 4 | | | | | |
| Phenol Resin 6 | | | | | |
| Phenol Resin 7 | 5.91 | | | 3.73 | 2.51 |
| Phenol Resin 8 | | 6.00 | | | |
| Phenol Resin 9 | | | 5.71 | | |
| Phenol Resin 10 | | | | | |
| Epoxy Resin 2 | | | | | |
| Epoxy Resin 3 | | | | | |
| Epoxy Resin 4 | | | | | |
| Epoxy Resin 5 | | | | | |
| Epoxy Resin 6 | 6.57 | 6.48 | 6.77 | 7.15 | 7.47 |
| Epoxy Resin 7 | | | | | |
| Epoxy Resin 8 | | | | | |
| Epoxy Resin 9 | | | | | |
| Inorganic Filler 1 | 86.5 | 86.5 | 86.5 | 86.5 | 86.5 |
| Curing Accelerator 1 | 0.4 | 0.4 | 0.4 | 0.4 | 0.4 |
| Curing Accelerator 2 | | | | | |
| Curing Accelerator 3 | | | | | |
| Curing Accelerator 4 | | | | | |
| Curing Accelerator 5 | | | | | |
| Compound (E) | | | | | |
| Flame Retardant 1 | | | | | |
| Flame Retardant 2 | | | | | |
| Silane Coupling Agent 1 | 0.07 | 0.07 | 0.07 | 0.07 | 0.07 |
| Silane Coupling Agent 2 | 0.07 | 0.07 | 0.07 | 0.07 | 0.07 |
| Silane Coupling Agent 3 | 0.08 | 0.08 | 0.08 | 0.08 | 0.08 |
| Coloring Agent | 0.3 | 0.3 | 0.3 | 0.3 | 0.3 |
| Releasing Agent | 0.1 | 0.1 | 0.1 | 0.1 | 0.1 |
| Spiral Flow (cm) | 121 | 113 | 108 | 109 | 123 |
| Frame Resistance Test Fmax (sec) | 5 | 4 | 7 | 7 | 8 |
| Frame Resistance Test ΣF (sec) | 21 | 19 | 25 | 28 | 31 |
| Frame Resistance Test Rank | V-0 | V-0 | V-0 | V-0 | V-0 |
| Wire Sweeping Ratio [%] | 2.9 | 3.1 | 3.2 | 3.1 | 3.2 |
| Continuous Molding Property Defective Filling | ○ | ○ | ○ | ○ | ○ |
| Continuous Molding Property Defective Transfer | ○ | ○ | ○ | ○ | ○ |
| Solder Resistance Test 2 (Number of defective ones in n = 6) | 0/6 | 0/6 | 0/6 | 0/6 | 0/6 |
| Solder Resistance Test 3 (Number of defective ones in n = 6) | 0/6 | 0/6 | 0/6 | 0/6 | 0/6 |

TABLE 6

| | Example | | | | | | |
|---|---|---|---|---|---|---|---|
| | 20 | 21 | 22 | 23 | 24 | 25 | 26 |
| Phenol Resin 3 | | | | | | | |
| Phenol Resin 4 | | | | | | | |
| Phenol Resin 6 | | | | | | | |
| Phenol Resin 7 | 5.99 | 5.90 | 5.18 | 5.18 | 5.54 | 5.32 | 5.45 |
| Phenol Resin 8 | | | | | | | |
| Phenol Resin 9 | | | | | | | |
| Phenol Resin 10 | | | | | | | |
| Epoxy Resin 2 | | | | | 4.26 | | |
| Epoxy Resin 3 | | | | 5.59 | | | |
| Epoxy Resin 4 | | | | | | 5.85 | |
| Epoxy Resin 5 | | | | | | | 4.31 |
| Epoxy Resin 6 | 6.64 | | | | 2.84 | 1.46 | 2.87 |
| Epoxy Resin 7 | | 6.73 | | | | | |
| Epoxy Resin 8 | | | 7.45 | | | | |
| Epoxy Resin 9 | | | | 1.86 | | | |
| Inorganic Filler 1 | 86.5 | 86.5 | 86.5 | 86.5 | 86.5 | 86.5 | 86.5 |
| Curing Accelerator 1 | | | | | | | |
| Curing Accelerator 2 | | | | | | | |
| Curing Accelerator 3 | 0.25 | 0.25 | 0.25 | 0.25 | 0.25 | 0.25 | 0.25 |
| Curing Accelerator 4 | | | | | | | |
| Curing Accelerator 5 | | | | | | | |
| Compound (E) | | | | | | | |
| Flame Retardant 1 | | | | | | | |
| Flame Retardant 2 | | | | | | | |
| Silane Coupling Agent 1 | 0.07 | 0.07 | 0.07 | 0.07 | 0.07 | 0.07 | 0.07 |
| Silane Coupling Agent 2 | 0.07 | 0.07 | 0.07 | 0.07 | 0.07 | 0.07 | 0.07 |

TABLE 6-continued

|  |  | Example | | | | | | |
|---|---|---|---|---|---|---|---|---|
|  |  | 20 | 21 | 22 | 23 | 24 | 25 | 26 |
| Silane Coupling Agent 3 | | 0.08 | 0.08 | 0.08 | 0.08 | 0.08 | 0.08 | 0.08 |
| Coloring Agent | | 0.3 | 0.3 | 0.3 | 0.3 | 0.3 | 0.3 | 0.3 |
| Releasing Agent | | 0.1 | 0.1 | 0.1 | 0.1 | 0.1 | 0.1 | 0.1 |
| Spiral Flow (cm) | | 123 | 114 | 112 | 104 | 113 | 111 | 105 |
| Frame Resistance Test Fmax (sec) | | 5 | 8 | 5 | 2 | 4 | 8 | 7 |
| Frame Resistance Test ΣF (sec) | | 21 | 23 | 23 | 8 | 19 | 32 | 28 |
| Frame Resistance Test Rank | | V-0 | V-0 | V-0 | V-0 | V-0 | V-0 | V-0 |
| Wire Sweeping Ratio [%] | | 2.9 | 3.2 | 3.4 | 3.4 | 3.6 | 3.1 | 3.2 |
| Continuous Molding Property | Defective Filling | ○ | ○ | ○ | ○ | ○ | ○ | ○ |
| | Defective Transfer | ○ | ○ | ○ | ○ | ○ | ○ | ○ |
| Solder Resistance Test 2 (Number of defective ones in n = 6) | | 0/6 | 0/6 | 0/6 | 0/6 | 0/6 | 0/6 | 0/6 |
| Solder Resistance Test 3 (Number of defective ones in n = 6) | | 0/6 | 0/6 | 0/6 | 0/6 | 0/6 | 0/6 | 0/6 |

TABLE 7

|  |  | Example | | | | | | |
|---|---|---|---|---|---|---|---|---|
|  |  | 27 | 28 | 29 | 30 | 31 | 32 | 33 |
| Phenol Resin 3 | | | | | | | | |
| Phenol Resin 4 | | | | | | | | |
| Phenol Resin 6 | | | | | | | | |
| Phenol Resin 7 | | | | | | | | |
| Phenol Resin 8 | | 5.28 | 5.26 | 5.34 | 5.34 | 5.34 | | |
| Phenol Resin 9 | | | | | | | 4.96 | 4.96 |
| Phenol Resin 10 | | | | | | | | |
| Epoxy Resin 2 | | | | | | | | |
| Epoxy Resin 3 | | 4.32 | 4.30 | 4.37 | 4.37 | 4.37 | | |
| Epoxy Resin 4 | | | | | | | | |
| Epoxy Resin 5 | | | | | | | 7.47 | 7.47 |
| Epoxy Resin 6 | | | | | | | | |
| Epoxy Resin 7 | | 2.88 | 2.87 | 2.91 | 2.91 | 2.91 | | |
| Epoxy Resin 8 | | | | | | | | |
| Epoxy Resin 9 | | | | | | | | |
| Inorganic Filler 1 | | 86.5 | 86.5 | 86.5 | 86.5 | 86.5 | 82.5 | 82.5 |
| Curing Accelerator 1 | | 0.4 | | | | | | |
| Curing Accelerator 2 | | | 0.45 | | | | 0.45 | 0.45 |
| Curing Accelerator 3 | | | | 0.25 | | | | |
| Curing Accelerator 4 | | | | | 0.25 | | | |
| Curing Accelerator 5 | | | | | | 0.2 | | |
| Compound (E) | | | | | | 0.06 | | |
| Flame Retardant 1 | | | | | | | 4.0 | |
| Flame Retardant 2 | | | | | | | | 4.0 |
| Silane Coupling Agent 1 | | 0.07 | 0.07 | 0.07 | 0.07 | 0.07 | 0.07 | 0.07 |
| Silane Coupling Agent 2 | | 0.07 | 0.07 | 0.07 | 0.07 | 0.07 | 0.07 | 0.07 |
| Silane Coupling Agent 3 | | 0.08 | 0.08 | 0.08 | 0.08 | 0.08 | 0.08 | 0.08 |
| Coloring Agent | | 0.3 | 0.3 | 0.3 | 0.3 | 0.3 | 0.3 | 0.3 |
| Releasing Agent | | 0.1 | 0.1 | 0.1 | 0.1 | 0.1 | 0.1 | 0.1 |
| Spiral Flow (cm) | | 105 | 104 | 97 | 104 | 113 | 106 | 104 |
| Frame Resistance Test Fmax (sec) | | 5 | 5 | 5 | 5 | 5 | 3 | 2 |
| Frame Resistance Test ΣF (sec) | | 21 | 21 | 21 | 21 | 21 | 8 | 9 |
| Frame Resistance Test Rank | | V-0 | V-0 | V-0 | V-0 | V-0 | V-0 | V-0 |
| Wire Sweeping Ratio [%] | | 3.8 | 2.9 | 3.6 | 3.9 | 3.5 | 3.7 | 4.1 |
| Continuous Molding Property | Defective Filling | ○ | ○ | ○ | ○ | ○ | ○ | ○ |
| | Defective Transfer | ○ | ○ | ○ | ○ | ○ | ○ | ○ |

TABLE 7-continued

| | Example | | | | | | |
|---|---|---|---|---|---|---|---|
| | 27 | 28 | 29 | 30 | 31 | 32 | 33 |
| Solder Resistance Test 2 (Number of defective ones in n = 6) | 0/6 | 0/6 | 0/6 | 0/6 | 0/6 | 0/6 | 0/6 |
| Solder Resistance Test 3 (Number of defective ones in n = 6) | 0/6 | 0/6 | 0/6 | 0/6 | 0/6 | 0/6 | 0/6 |

TABLE 8

| | Comparative Example | | | | |
|---|---|---|---|---|---|
| | 5 | 6 | 7 | 8 | 9 |
| Phenol Resin 3 | | | | | |
| Phenol Resin 4 | 5.79 | | | 2.89 | 3.02 |
| Phenol Resin 6 | | 5.77 | | 2.89 | |
| Phenol Resin 7 | | | | | |
| Phenol Resin 8 | | | | | |
| Phenol Resin 9 | | | | | |
| Phenol Resin 10 | | | 6.28 | | 3.02 |
| Epoxy Resin 2 | | | | | |
| Epoxy Resin 3 | | | | | |
| Epoxy Resin 4 | | | | | |
| Epoxy Resin 5 | | | | | |
| Epoxy Resin 6 | 6.69 | 6.71 | 6.20 | 6.70 | 6.44 |
| Epoxy Resin 7 | | | | | |
| Epoxy Resin 8 | | | | | |
| Epoxy Resin 9 | | | | | |
| Inorganic Filler 1 | 86.5 | 86.5 | 86.5 | 86.5 | 86.5 |
| Curing Accelerator 1 | 0.4 | 0.4 | 0.4 | 0.4 | 0.4 |
| Curing Accelerator 2 | | | | | |
| Curing Accelerator 3 | | | | | |
| Curing Accelerator 4 | | | | | |
| Curing Accelerator 5 | | | | | |
| Compound (E) | | | | | |
| Flame Retardant 1 | | | | | |
| Flame Retardant 2 | | | | | |
| Silane Coupling Agent 1 | 0.07 | 0.07 | 0.07 | 0.07 | 0.07 |
| Silane Coupling Agent 2 | 0.07 | 0.07 | 0.07 | 0.07 | 0.07 |
| Silane Coupling Agent 3 | 0.08 | 0.08 | 0.08 | 0.08 | 0.08 |
| Coloring Agent | 0.3 | 0.3 | 0.3 | 0.3 | 0.3 |
| Releasing Agent | 0.1 | 0.1 | 0.1 | 0.1 | 0.1 |
| Spiral Flow (cm) | 103 | 94 | 92 | 99 | 86 |
| Frame Resistance Test Fmax (sec) | 16 | 30 | 5 | 30 | 11 |
| Frame Resistance Test ΣF (sec) | 35 | 150 | 21 | 150 | 34 |
| Frame Resistance Test Rank | V-1 | Burnout | V-0 | Burnout | V-1 |
| Wire Sweeping Ratio [%] | 3.9 | 5.5 | 6 | 4.9 | 6 |
| Continuous Molding Property — Defective Filling | 300 | 150 | 100 | 200 | 150 |
| Continuous Molding Property — Defective Transfer | 185 | ○ | ○ | ○ | ○ |
| Solder Resistance Test 2 (Number of defective ones in n = 6) | 1/6 | 0/6 | 0/6 | 0/6 | 0/6 |
| Solder Resistance Test 3 (Number of defective ones in n = 6) | 3/6 | 2/6 | 1/6 | 2/6 | 2/6 |

Respective Examples 1 to 14 include a composition containing a phenol resin having structural units represented by the general formulae (1) and (2), and having an aromatic group having at least one alkyl group with 1 to 3 carbon atoms at least at one end; an epoxy resin; and an inorganic filler, one obtained by changing the kind of phenol and the mixing ratio, one obtained by changing the kind of the epoxy resin, or one obtained by changing the kind of the curing accelerator. The results showed that all of Examples 1 to 14 exhibited excellent balance of flowability (spiral flow), flame resistance and solder resistance. On the other hand, respective Comparative Examples 1 to 4 do not comprise a phenol resin having structural units represented by the general formulae (1) and (2), and having an aromatic group having at least one alkyl group with 1 to 3 carbon atoms at least at one end. The results showed that Comparative Examples 1 to 4 exhibited low flowability (spiral flow), deteriorated flame resistance and inferior solder resistance.

Furthermore, respective Examples 15 to 33 include a composition containing a phenol resin containing a polymer (A1) having structural units represented by the formula (31) and structural units represented by the formula (32); an epoxy resin; and an inorganic filler, one obtained by changing the mixing ratio of structural units of the phenol resin, one containing other curing agent in addition to the phenol resin, one obtained by changing the kind of the epoxy resin, one obtained by changing the kind of the curing accelerator, or one obtained by changing the kind of the flame retardant. The results showed that all of Examples 15 to 33 exhibited excellent balance of flowability (spiral flow), wire sweeping ratio, flame resistance, continuous molding property and solder resistance.

On the other hand, in Comparative Example 6 changing its component to the phenol resin 4 having structural units represented by the general formula (31) but without having structural units represented by the general formula (32), in respective Comparative Examples 7 and 8 changing its component to the phenol resins 6 and 10 having structural units represented by the general formula (32) but without having structural units represented by the general formula (31), and in respective Comparative Examples 9 and 10 using the phenol resin 4 and the phenol resin 6 or 10 together, the results showed that any items of flowability (spiral flow), wire sweeping ratio, flame resistance, continuous molding property and solder resistance were not sufficient and a balance of properties was inferior.

As shown in the above results, in the resin composition including a curing agent, an epoxy resin and an inorganic filler, only when a phenol resin including a polymer (A1) having structural units represented by the general formula (31) and structural units represented by the general formula (32) was used as a curing agent, the results showed that the resin composition exhibited excellent balance of flowability (spiral flow), wire sweeping ratio, flame resistance, continuous molding property and solder resistance. Effects were obtained, which were far more remarkable than those predicted or expected when a phenol resin having structural units represented by the formula (31) alone or a phenol resin having structural units represented by the formula (32) alone was used as a curing agent, or when both phenol resins were used together.

INDUSTRIAL APPLICABILITY

According to the present invention, there may be obtained a resin composition for encapsulating a semiconductor which has excellent flame resistance and solder resistance, and is excellent in flowability.

The present application claims priority based on Japanese Patent Application No. 2008-200160. The contents of the application are incorporated herein by reference in their entirety.

The invention claimed is:

1. A resin composition for encapsulating a semiconductor comprising: a phenol resin (A), an epoxy resin (B), and an inorganic filler (C); wherein the phenol resin (A) comprises at least one polymer component (A0) composed of a polymer having structural units represented by the following general formulae (1) and (2):

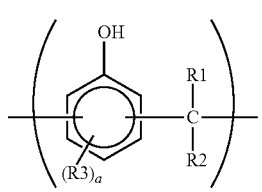
(1)

wherein, in the general formula (1), R1 and R2 are each independently a hydrogen atom or a hydrocarbon group having 1 to 6 carbon atoms; each R3 is independently a hydrocarbon group having 1 to 6 carbon atoms; and a is an integer of 0 to 3,

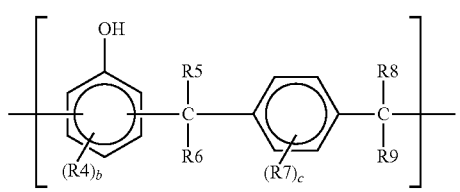
(2)

wherein, in the general formula (2), R5, R6, R8 and R9 are each independently a hydrogen atom or a hydrocarbon group having 1 to 6 carbon atoms; each R4 and R7 is independently a hydrocarbon group having 1 to 6 carbon atoms; b is an integer of 0 to 3; and c is an integer of 0 to 4; and wherein at least one of said at least one polymer component (A0) is composed of a polymer having structural units represented by general formulae (1) and (2) and terminated on at least one end with an aromatic group free of polar groups and containing at least one alkyl group having 1 to 3 carbon atoms.

2. The resin composition for encapsulating a semiconductor as claimed in claim 1, wherein said phenol resin (A) further comprises at least one polymer component (A1) composed of a polymer having structural units represented by the following general formulae (31) and (32):

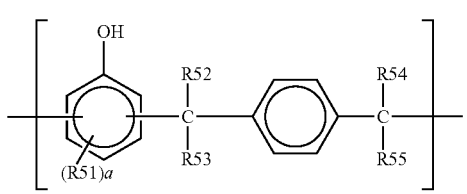
(31)

wherein, in the above general formula (31), each R51 is independently a hydrocarbon group having 1 to 6 carbon atoms; a is an integer of 0 to 3; and R52, R53, R54 and R55 are each independently a hydrogen atom or a hydrocarbon group having 1 to 6 carbon atoms,

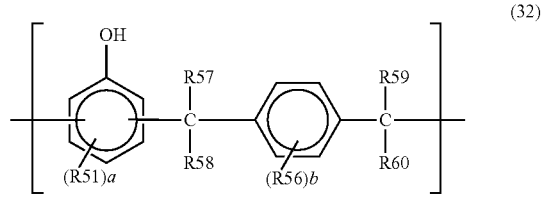
(32)

wherein, in the above the general formula (32), each R51 is independently a hydrocarbon group having 1 to 6 carbon atoms; a is an integer of 0 to 3; each R56 is independently a hydrocarbon group having 1 to 6 carbon atoms; b is an integer of 1 to 4; and R57, R58, R59 and R60 are each independently a hydrogen atom or a hydrocarbon group having 1 to 6 carbon atoms; wherein each of said at least one polymer component (A0) are composed of same or different polymers when more than one polymer component (A0) are present; and wherein each of said at least one polymer component (A1) are composed of same or different polymers when more than one polymer component (A1) are present.

3. The resin composition for encapsulating a semiconductor as claimed in claim 2, when measured by field desorption mass spectrometry, exhibits a total relative intensity of polymers corresponding to the at least one polymer component (A1) of from 10% to 80%, based on a total relative intensity of said phenol resin (A).

4. The resin composition for encapsulating a semiconductor as claimed in claim 2, wherein said phenol resin (A) further comprises a polymer component (A2) composed of a polymer having structural units represented by the general formula (31) but without having structural units represented by the general formula (32).

5. The resin composition for encapsulating a semiconductor as claimed in claim 2, wherein said phenol resin (A) further comprises a polymer component (A3) composed of a polymer having structural units represented by the general formula (32) but without having structural units represented by the general formula (31).

6. The resin composition for encapsulating a semiconductor as claimed in claim 2, wherein said phenol resin (A) features a ratio of structural units represented by the general formula (31) to structural units represented by the general formula (32) of from 30/70 to 95/5, based on the total phenol resin (A).

7. The resin composition for encapsulating a semiconductor as claimed in claim 2, wherein R56 is a methyl group, and b is an integer of 1 to 3 in structural units represented by the general formula (32).

8. The resin composition for encapsulating a semiconductor as claimed in claim 1, wherein said aromatic group free of polar groups and containing at least one alkyl group having 1 to 3 carbon atoms is a trimethylphenyl group.

9. The resin composition for encapsulating a semiconductor as claimed in claim 1, wherein at least one of said at least one polymer component (A0) is composed of a polymer represented by the following general formula (3):

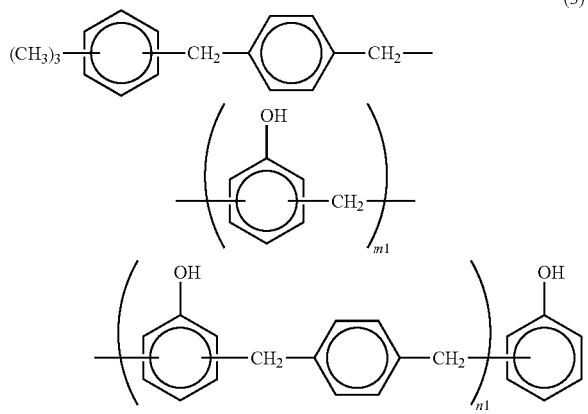

(3)

wherein, in the general formula (3), m1 is a mean value and is a number of from 0.3 to 7;
and n1 is a mean value and is a number of from 0.3 to 7.

10. The resin composition for encapsulating a semiconductor as claimed in claim 1, wherein at least one of said at least one polymer component (A0) is composed of a polymer represented by the following general formula (4):

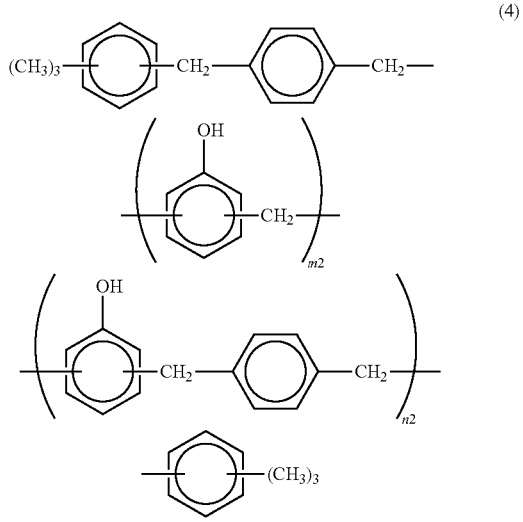

(4)

wherein, in the general formula (4), m2 is a mean value and is a number of from 0.3 to 7;
and n2 is a mean value and is a number of from 0.1 to 4.

11. The resin composition for encapsulating a semiconductor as claimed in claim 1, further comprising a curing agent other than said phenol resin (A).

12. The resin composition for encapsulating a semiconductor as claimed in claim 1, wherein said epoxy resin (B) is at least one epoxy resin selected from the groups consisting of a biphenyl type epoxy resin, a bisphenol type epoxy resin, a stilbene type epoxy resin, an anthracenediol type epoxy resin, a phenol novolac type epoxy resin, a cresol novolac type epoxy resin, a triphenolmethane type epoxy resin, an alkyl-modified triphenolmethane type epoxy resin, a phenol aralkyl type epoxy resin having a phenylene skeleton, a phenol aralkyl type epoxy resin having a biphenylene skeleton, a naphthol aralkyl type epoxy resin having a phenylene skeleton, a dihydroxy naphthalene type epoxy resin, an epoxy resin obtained by glycidyl etherification of dimers of dihydroxy naphthalene, a novolac type epoxy resin having a methoxynaphthalene skeleton, triglycidyl isocyanurate, monoallyl diglycidyl isocyanurate and a dicyclopentadiene-modified phenol type epoxy resin.

13. The resin composition for encapsulating a semiconductor as claimed in claim 1, wherein said inorganic filler (C) is present in an amount of from 80 to 93% by mass of the resin composition.

14. The resin composition for encapsulating a semiconductor as claimed in claim 1, further comprising a curing accelerator (D).

15. The resin composition for encapsulating a semiconductor as claimed in claim 14, wherein said curing accelerator (D) comprises at least one curing accelerator selected from the group consisting of a tetra-substituted phosphonium compound, a phosphobetaine compound, an adduct of a phosphine compound and a quinone compound, an adduct of a phosphonium compound and a silane compound; and combinations thereof.

16. The resin composition for encapsulating a semiconductor as claimed in claim 1, further comprising a monocyclic or polycyclic aromatic compound (E), wherein at least two adjacent ring carbon atoms of the monocyclic or polycyclic aromatic compound are bonded to hydroxyl groups.

17. The resin composition for encapsulating a semiconductor as claimed in claim 1, further comprising a coupling agent (F).

18. The resin composition for encapsulating a semiconductor as claimed in claim 17, wherein said coupling agent (F) comprises a silane coupling agent having a secondary amino group.

19. The resin composition for encapsulating a semiconductor as claimed in claim 1, further comprising an inorganic flame retardant.

20. The resin composition for encapsulating a semiconductor as claimed in claim 19, wherein said inorganic flame retardant comprises metal hydroxide or complex metal hydroxide.

21. A semiconductor device, obtained by encapsulating a semiconductor element with the resin composition for encapsulating a semiconductor as claimed in claim 1.

* * * * *